(12) United States Patent
Onoe

(10) Patent No.: US 8,176,784 B2
(45) Date of Patent: May 15, 2012

(54) ELASTIC WAVE DEVICE AND ELECTRONIC COMPONENT

(75) Inventor: Morio Onoe, Setagaya-ku (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 315 days.

(21) Appl. No.: 12/660,369

(22) Filed: Feb. 25, 2010

(65) Prior Publication Data

US 2010/0223999 A1 Sep. 9, 2010

(30) Foreign Application Priority Data

Mar. 3, 2009 (JP) .................................. 2009-48862

(51) Int. Cl.
*G01N 29/00* (2006.01)
*H01L 41/04* (2006.01)
(52) U.S. Cl. ..................... 73/579; 73/645; 310/313 D
(58) Field of Classification Search .................... 73/579, 73/645; 310/313 D, 313 R, 320, 366
See application file for complete search history.

(56) References Cited

U.S. PATENT DOCUMENTS

| 5,969,463 | A  | * | 10/1999 | Tomita et al. | 310/320 |
|-----------|----|---|---------|---------------|---------|
| 6,232,699 | B1 | * | 5/2001  | Wajima        | 310/320 |
| 6,750,593 | B2 | * | 6/2004  | Iwata         | 310/321 |
| 7,791,434 | B2 | * | 9/2010  | Fazzio et al. | 333/187 |
| 7,868,522 | B2 | * | 1/2011  | Ruby          | 310/346 |
| 2010/0164325 | A1 | * | 7/2010 | Onoe        | 310/320 |
| 2010/0171390 | A1 | * | 7/2010 | Onoe        | 310/320 |

FOREIGN PATENT DOCUMENTS

| JP | 43-15538   | 6/1943 |
|----|------------|--------|
| JP | 50-019024  | 1/1993 |
| JP | 2000-091878| 3/2000 |

OTHER PUBLICATIONS

"Improvement of Frequency Drift of At-Cut Resonators using an Unelectroded Resonant Region", IEEE International Frequency Control Sumposium and PDA Exhibition, 2001, p. 624, Fig. 1(b), Fig. 7.
"Straight Crested WAve Analysis of Quartz Mems Ring Electroded Mesa Resonators", IEEE Ultrasonics Symposium, 2002, p. 999, Fig. 2.
3-D Modeling of High-Q Quartz Resonators for VHF-UHF Applications, Proceedings of the 2003 IEEE International Frequency Control Symposium and PDA Exhibition Jointly with 17th European Frequency and Time Forum, 2003, p. 824, Fig. 2.

* cited by examiner

*Primary Examiner* — J M Saint Surin
(74) *Attorney, Agent, or Firm* — Jordan and Hamburg LLP

(57) ABSTRACT

To provide an elastic wave device that is small sized and in which a frequency fluctuation due to a change with time hardly occurs, and an electronic component using the above elastic wave device. A trapping energy mode portion 2 provided in an elastic wave waveguide 10 made of a piezoelectric material excites a second elastic wave being an elastic wave in a trapping energy mode by a specific frequency component included in a first elastic wave being an elastic wave such as a SAW propagated from a first propagation mode portion 4, and a cutoff portion 3 provided in a peripheral region of the trapping energy mode portion 2 has a cutoff frequency being a frequency higher than that of the second elastic wave. A second propagation mode portion mode-converts the second elastic wave leaked through the cutoff portion to a third elastic wave being the elastic wave in the propagation mode to propagate the third elastic wave.

30 Claims, 18 Drawing Sheets

(a) RESIST COATING (b) RESIST PATTERNING (c) DRY ETCHING (d) RESIST COATING (e) RESIST PATTERNING (f) DRY ETCHING

ELASTIC WAVE DEVICE AND ELECTRONIC COMPONENT

BACKGROUND OF THE INVENTION

1. Field of the Invention

The present invention relates to an elastic wave device using a trapping energy effect, and particularly relates to a technique to miniaturize the elastic wave device.

2. Description of the Related Art

When controlling frequency or selecting frequency in a small-sized high frequency communication device such as a portable terminal, there is a is small-sized high frequency communication device employing an oscillator or a filter using a trapping energy type resonator (hereinafter, the oscillator and the filter are generically called an elastic wave device).

A trapping energy type elastic wave device obtains a necessary frequency response by using resonance to occur by trapping energy of thickness vibration in a piezoelectric body of quartz-crystal or the like. The thickness vibration to be used in the elastic wave device of this type vibrates at a frequency on a high frequency side in the vicinity of a cutoff frequency of the piezoelectric body. Thus, electrodes for excitation are provided at center portions on an upper surface and a lower surface of, for example, a plate-shaped piezoelectric body, and a resonant frequency of thickness vibration in a region having the electrodes provided thereon is reduced by a mass loading effect of the electrodes to be lower than a cutoff frequency of the thickness vibration in a peripheral portion to thereby achieve trapping of the energy of the thickness vibration in the region having the electrodes provided thereon.

Here, a cutoff frequency of a piezoelectric body is in inverse proportion to a thickness of the piezoelectric body, so that it is necessary to thin the piezoelectric body in order to increase a resonant frequency of vibration to be obtained by trapping energy, (which is called a trapping energy mode), and in combination with miniaturization and sophistication in performance of a portable terminal, and the like, the elastic wave device is rapidly miniaturized.

However, when the piezoelectric body is thinned in order to increase the resonant frequency, it is also necessary to thin the electrodes to be suitable for trapping energy. When the electrodes are thinned, there is a fear that an insertion loss of the whole elastic wave device is increased due to an insufficiency of electric conductivity.

Normally, however, there is a high fear that masses of the electrodes constituted by metal and the like change with time due to oxidation, corrosion, or the like, and the elastic wave device to have the electrodes directly provided on the region where trapping energy is performed, (which will be called a trapping energy portion, hereinafter), has a problem that the resonant frequency changes by an influence of a mass change in the electrodes.

Thus, in order to suppress the above influence of the change with time in the electrode masses, various types of elastic wave devices to have no electrode provided on a region where resonance is generated are proposed. In Patent Document 1, for example, there is disclosed a resonator in which electrodes for excitation are provided at both right and left ends of a plate-shaped piezoelectric body, and a center region sandwiched between regions of both the right and left ends is not provided with an electrode to be set as a region to determine a resonant frequency, and groove-shaped cuts are provided between the region of the right end and the center region and between the region of the left end and the center region, thereby separating the respective regions elastically and moderately. Further, in Patent Document 2 and Non Patent Document 1, there is disclosed a piezoelectric vibrator in which electrodes for excitation are provided on regions of both right and left ends of a plate-shaped piezoelectric substrate, and an electrode is not provided on a center region sandwiched between these regions, and by making a thickness of the region having no electrode provided thereon thicker than those of the regions of both the ends, resonant frequencies of these regions are made approximately the same, thereby enabling the respective regions to be coupled to one another acoustically.

Besides the above, in Non Patent Document 2 and Non Patent Document 3, there is disclosed a resonator of a type in which a region without an electrode, which is formed thicker than a periphery and called a mesa, is provided at a center portion of a plate-shaped piezoelectric body, and electrodes for excitation are formed in a groove formed in a periphery of this mesa to obtain resonance by using the electrodes and a trapping energy effect to occur in the mesa surrounded by the electrodes.

These resonators (the piezoelectric vibrator) disclosed in Patent Document 1, Patent Document 2, and Non Patent Document 1 to Non Patent Document 3, by providing the region of a center side without an electrode being provided independently of the regions for excitation provided with the electrodes, manage to have little effect of the change with time to occur in the electrodes on the region of the center side, and thus increase long-term frequency stability as a whole of the resonator or the piezoelectric vibrator (the elastic wave device).

Incidentally, in Patent Document 3, there is disclosed a technique in which thicknesses of regions of both ends with electrodes provided thereon of a vibration wave propagating medium to be a vibrator are thinned, and on the other hand, a thickness of a center region sandwiched between these regions and having no electrode provided thereon is thickened, and further a length of the above center region is adjusted to satisfy a predetermined condition, thereby taking out only a desired harmonic vibration from among a plurality of harmonics excited in the electrode on one side. As described above, in the vibrator disclosed in Patent Document 3, an object of providing the center region without an electrode is different from that of stability of a resonant frequency.

[Patent Document 1]
Japanese Patent Publication No. Sho 43-15538: page 2 left column lines 12 to 23, FIG. 2a

[Patent Document 2]
Japanese Patent Application Laid-open No. 2000-91878: claim 1, paragraphs 0024 and 0025, FIG. 4

[Patent Document 3]
Japanese Patent Publication No. Sho 50-19024: page 173 column 2 lines 16 to 30, FIG. 2(b)

[Non Patent Document 1]
"IMPROVEMENT OF FREQUENCY DRIFT OF AT-CUT RESONATORS USING AN UNELECTRODED RESONANT REGION", IEEE International Frequency Control Symposium and PDA Exhibition, 2001, p. 624, FIG. 1(b), FIG. 7

[Non Patent Document 2]
"STRAIGHT CRESTED WAVE ANALYSIS OF QUARTZ MEMS RING ELECTRODED MESA RESONATORS", IEEE ULTRASONICS SYMPOSIUM, 2002, P. 999, FIG. 2

[Non Patent Document 3]
"3-D MODELING OF HIGH-Q QUARTZ RESONATORS FOR VHF-UHF APPLICATIONS", Proceedings of the 2003 IEEE International Frequency Control Symposium and PDA Exhibition Jointly with 17th European Frequency and Time Forum, 2003, p. 824, FIG. 2

SUMMARY OF THE INVENTION

Each elastic wave device disclosed in above-described Patent Document 1, Patent Document 2, Non Patent Document 1 to Non Patent Document 3 is structured in a manner that an electrode is not provided on a center region to obtain resonance in order to suppress an influence on a resonant frequency based on a change with time in mass of an electrode. However, these elastic wave devices are constituted as what is called a composite resonator (composite vibrator) type elastic wave device to generate resonance by using vibration in the same mode as a vibration mode generated in regions having electrodes provided thereon, so that it is not possible to completely eliminate the influence that a frequency change in the vibration mode due to a mass change in the electrodes has on the resonant frequency to be obtained in the region having no electrode provided thereon.

Particularly, when a piezoelectric body of the elastic wave device is thinned in order to obtain high frequency resonance, a change rate of a mass loading effect increases even though a slight mass change of the piezoelectric body occurs. Thus, the frequency change in the vibration mode to be excited in the regions having the electrodes provided thereon also increases, resulting that the resonant frequency also changes significantly. Accordingly, it is not possible to stabilize the resonant frequency sufficiently in conventional methods disclosed in above-described respective Patent Documents and Non Patent Documents, and the change with time in the electrode mass is still a significant obstacle to a further increase in frequency and miniaturization of the elastic wave device.

The present invention has been made under such circumstances, and an object thereof is to provide an elastic wave device that is small sized and in which a frequency fluctuation due to aging hardly occurs, and an electronic component using the above elastic wave device.

An elastic wave device according to the first invention includes:

a first propagation mode portion provided in an elastic wave waveguide and provided with a first IDT electrode for making a piezoelectric material excite a first elastic wave being an elastic wave in a propagation mode;

a trapping energy mode portion provided in the elastic wave waveguide and in which a second elastic wave being an elastic wave in a trapping energy mode is excited by a specific frequency component included in the first elastic wave propagated from the first propagation mode portion;

a cutoff portion provided in a peripheral region of the trapping energy mode portion and having a cutoff frequency being a frequency higher than that of the second elastic wave; and a second propagation mode portion provided at a position adjacent to the trapping energy mode portion across the cutoff portion along a direction in which the first elastic wave propagates, and mode-converting the second elastic wave leaked through the cutoff portion to a third elastic wave being the elastic wave in the propagation mode to propagate the third elastic wave and provided with a second IDT electrode for taking the third elastic wave out of the piezoelectric material as an electrical signal.

The elastic wave device according to the first invention may also include the following characteristics.

(a) The first propagation mode portion is also used as the second propagation mode portion.

(b) An elastic wave waveguide for reference provided with a third IDT electrode for making a piezoelectric material excite an elastic wave for reference and a fourth IDT electrode provided in a propagation direction of the elastic wave for reference in order to take an electrical signal in opposite phase to an electrical signal taken out in the second IDT electrode after the first elastic wave passes through the first propagation mode portion and the second propagation mode portion out of the elastic wave for reference via the piezoelectric material, is provided parallel to the elastic wave waveguide via an isolation zone of an elastic wave, and a differential signal made after the electrical signal taken out of the second IDT electrode and the electrical signal taken out of the fourth IDT electrode are added is obtained.

Next, an elastic wave device according to the second invention includes:

a first propagation mode portion provided in a first elastic wave waveguide and provided with a first IDT electrode for making a piezoelectric material excite a first elastic wave being an elastic wave in a propagation mode;

a trapping energy mode portion provided in the first elastic wave waveguide and in which a second elastic wave being an elastic wave in a trapping energy mode is excited by a specific frequency component included in the first elastic wave propagated from the first propagation mode portion;

a cutoff portion provided in a peripheral region of the trapping energy mode portion and having a cutoff frequency being a frequency higher than that of the second elastic wave;

a second elastic wave waveguide adjacent to the first elastic wave waveguide in a direction perpendicular to a traveling direction of the first elastic wave;

a second IDT electrode provided in the second elastic wave waveguide; and an isolation zone provided between the first elastic wave waveguide and the second elastic wave waveguide and provided with a cutout portion having one portion thereof cut out, and in which a third elastic wave being the elastic wave in the propagation mode obtained by reflecting the first elastic wave in the cutoff portion and the trapping energy mode portion is passed through the isolation zone via the cutout portion, and then the third elastic wave is received in the second IDT electrode to be taken out of the piezoelectric material as an electrical signal, and a region where the third elastic wave propagates is set as a second propagation mode portion.

The above-described elastic wave devices according to the first and second inventions may also include the following characteristics.

(c) The first IDT electrode and the second IDT electrode are provided on a front surface of the piezoelectric material and the first elastic wave and the third elastic wave are surface acoustic waves.

(d) The cutoff portion is formed to have a cutoff frequency being a frequency higher than that of the second elastic wave because a thickness of the elastic wave waveguide constituting the cutoff portion is thinner than that of the elastic wave waveguide constituting the trapping energy mode portion.

(e) The elastic wave waveguide is formed in a manner that a thickness of an outer region of the cutoff portion is thicker than that of the cutoff portion.

(f) The elastic wave waveguide is made of a piezoelectric material.

(g) The piezoelectric material is a piezoelectric film provided on an upper surface side of an IDT electrode formed on an elastic wave waveguide made of a non-piezoelectric material, or is a piezoelectric film provided between an elastic wave waveguide made of a non-piezoelectric material and an IDT electrode.

(h) The trapping energy mode portion is formed in a flat plate shape.

(i) The trapping energy mode portion is formed in a plano-convex lens shape.

(j) The trapping energy mode portion is formed in a manner that a planar shape thereof is a polygon with four or more angles, or a circle, or an ellipse.

(k) At least one of the first IDT electrode and the second IDT electrode is made of a uni-directional transducer electrode.

(l) The elastic wave device includes two or more trapping energy mode portions whose peripheries are each surrounded by the cutoff portion, and in which the trapping energy mode portions are provided adjacently to each other or one another in the propagation direction of the elastic wave in the propagation mode or in a direction perpendicular to the propagation direction to enable second elastic waves to be excited in the respective trapping energy mode portions to be coupled to each other or one another, and thereby a multi-mode coupled filter is constituted.

(m) The second elastic wave is an elastic wave in a high-order trapping energy mode.

(n) An adsorption layer to adsorb a substance to be sensed is formed on a front surface of the trapping energy mode portion.

An electronic component according to still another invention is an electronic component including each of the above-described elastic wave devices.

According to the present invention, a first elastic wave being an elastic wave in a propagation mode such as, for example, a surface acoustic wave is propagated in an elastic wave waveguide and in a trapping energy mode portion provided in the elastic wave waveguide and whose periphery is surrounded by a cutoff portion, a second elastic wave in a trapping energy mode is excited by a specific frequency component included in the first elastic wave, and thereby a resonance response can be obtained without providing an electrode on the trapping energy mode portion. Accordingly, a change in a frequency characteristic due to a mass change in an electrode does not occur in the trapping energy mode portion, so that it is possible to obtain an elastic wave device in which further miniaturization thereof is easy to be performed and a frequency fluctuation due to aging hardly occurs.

DETAILED DESCRIPTION OF THE PREFERRED EMBODIMENT(S)

Hereinafter, a constitution of an elastic wave resonator 1 being one example of an elastic wave device according to an embodiment will be explained with reference to FIG. 1 to FIG. 3. As illustrated in a perspective view in FIG. 1, the elastic wave resonator 1 is constituted in a manner that first and second IDT electrodes 41, 51 are provided on both right and left sides in a longitudinal direction across a center portion of a piezoelectric body 10 processed into a small piece shape, and regions having these IDT electrodes 41, 51 provided thereon and a region sandwiched between both the IDT electrodes 41 and 51 are set as an elastic wave waveguide, and at, for example, a center portion in the elastic wave waveguide, a trapping energy mode portion 2 for exciting an elastic wave in a trapping energy mode is provided.

Figure 1:
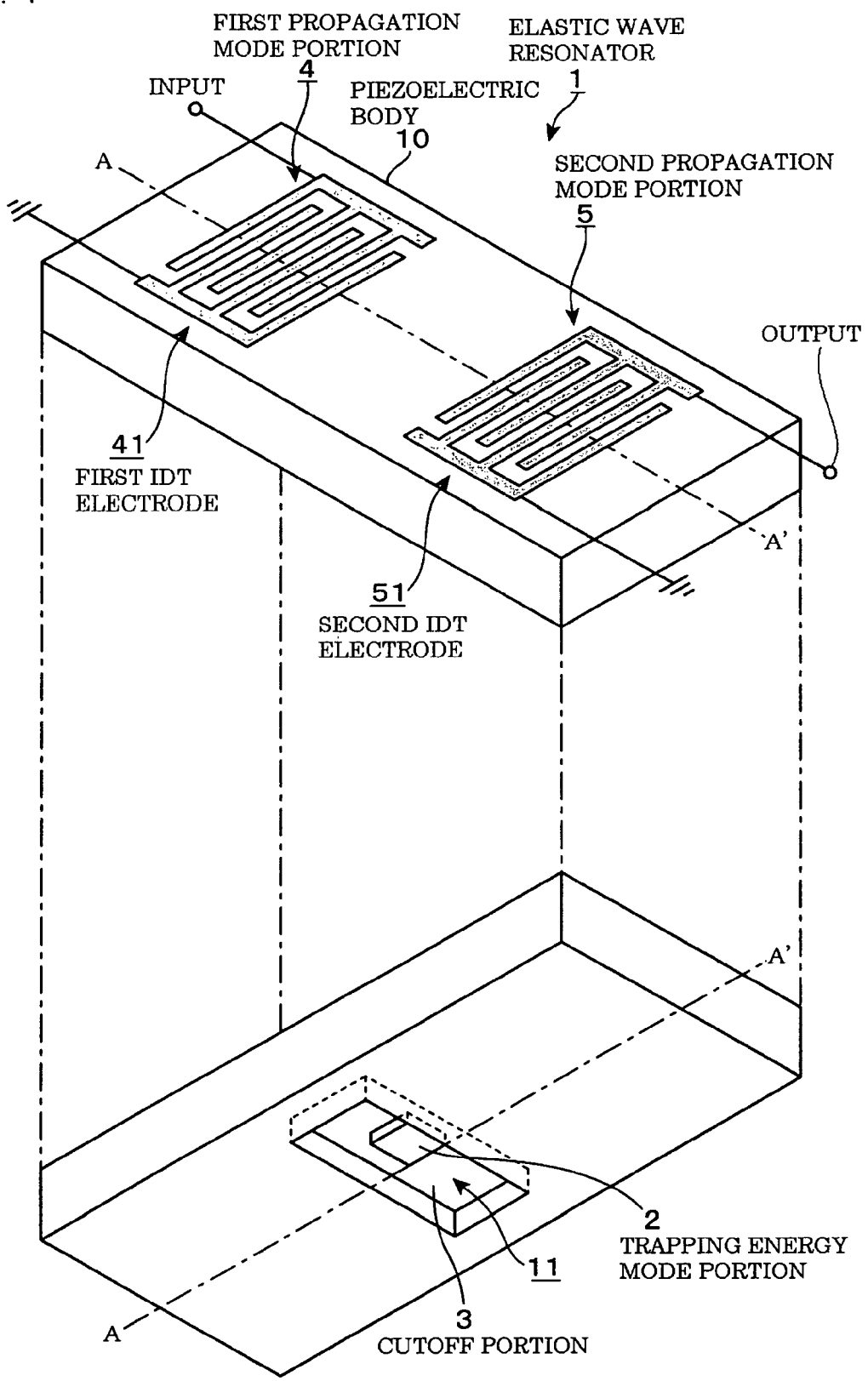
FIG. 1 is a perspective view illustrating an exterior constitution of an elastic wave resonator according to an embodiment.
Figure 2:
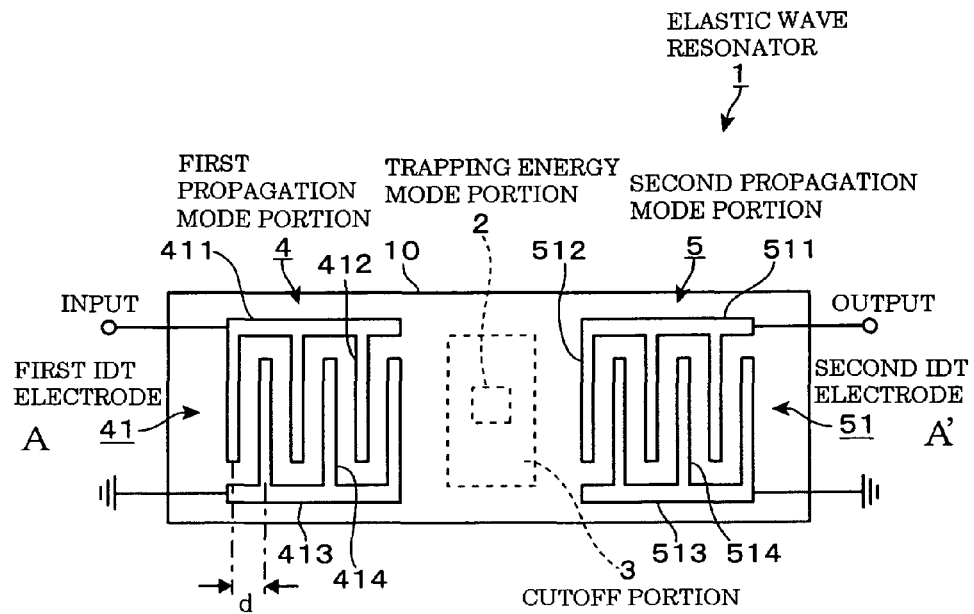
FIG. 2 is a plane view of the elastic wave resonator.

The piezoelectric body 10 is an AT cut quartz-crystal piece, for example, and is processed in a manner that a length in an A-A' direction (that corresponds to a direction in which elastic waves in propagation modes propagate and will be called the longitudinal direction, hereinafter) illustrated in FIG. 1 is, for example, about several hundred μm to several mm, a length in a direction perpendicular to the A-A' direction, (which will be called a width direction, hereinafter), is, for example, about ⅓ to half of the length in the longitudinal direction, and a thickness (that is described as "$h_3$" in FIG. 3) is, for example, several ten μm to several hundred μm.

The elastic wave waveguide described already is provided on one surface (that will be called a front surface, hereinafter) of the piezoelectric body 10, and the first IDT electrode 41 provided on, for example, the left region on the elastic wave waveguide is provided with a function to electro-mechanically convert an electrical signal input to the first IDT electrode 41 to excite, for example, a surface acoustic wave (that will be called a SAW, hereinafter) being an elastic wave. On the other hand, the second IDT electrode 51 provided on, for example, the right region on the elastic wave waveguide serves to mechano-electrically convert the SAW propagated through the elastic wave waveguide to take it out as an electrical signal.

The IDT electrodes 41, 51 are each provided with constitutions substantially similar to each other, and thus the constitution of, for example, the first IDT electrode 41 is explained simply. The first IDT electrode 41 is a well-known IDT (Inter Digital Transducer) electrode made of a metal film such as, for example, aluminum or gold, and is constituted in a manner that a large number of electrode fingers 412 are connected to a bus bar 411 and a large number of electrode fingers 414 are connected to a bus bar 413 in an interdigitated manner and the two bus bars 411, 413 are disposed along a propagation direction of a SAW in the elastic wave waveguide, for example. Each of the IDT electrodes illustrated in this embodiment is provided with, for example, the several ten to several hundred electrode fingers, but in each of the drawings, the number of the electrode fingers are omitted to be illustrated.

An interval "d" between the adjacent electrode fingers 412 and 414 in the first IDT electrode 41 is adjusted to a length of, for example, a half-wavelength of a SAW to be trapped in the trapping energy mode portion 2 that will be described later, for example. An input terminal of an electrical signal is connected to, for example, the bus bar 411 on one side in the first IDT electrode 41, and further the bus bar 413 on the other side is grounded.

The second IDT electrode 51 is constituted substantially similarly to the above-described first IDT electrode 41, and an output terminal of an electrical signal is connected to a bus bar 511 on one side and a bus bar 513 on the other side is grounded. A distance between the first IDT electrode 41 and the second IDT electrode 51 is set appropriately, but the distance is required to be a distance such that a later-described cutoff portion 3 and the trapping energy mode portion 2 are allowed to be disposed between these two IDT electrodes 41 and 51. Further, the second IDT electrode 51 is preferable to be disposed at a position where a later-described third elastic wave being the elastic wave in the propagation mode, which is leaked from the above-described cutoff portion 3, is added to, for example, the electrode fingers 512 in the second IDT electrode 51 on an output side in an inphase or opposite phase manner.

When an electrical signal is input to the first IDT electrode 41, a SAW is excited in the first IDT electrode 41, and the SAW propagates toward the second IDT electrode 51 on the output side in the vicinity of the front surface of the piezoelectric body 10 as the elastic wave in the propagation mode. The elastic wave resonator 1 according to this embodiment is structured to obtain resonance by using the above SAW. Hereinafter, a detailed constitution for obtaining resonance by using a SAW will be explained.

The trapping energy mode portion 2 and the cutoff portion 3 serve to mode-convert part of a SAW propagated in the piezoelectric body 10 and to excite an elastic wave in a trapping energy mode. The trapping energy mode portion 2 is a region where the elastic wave in the trapping energy mode is excited, and the cutoff portion 3 is a region to trap the above elastic wave in the trapping energy mode portion 2.

The trapping energy mode portion 2 is one region in the piezoelectric body 10 processed to have a thickness "$h_1$" capable of exciting the elastic wave in the trapping energy mode at a previously designed resonant frequency, and is provided at substantially the center position between the first IDT electrode 41 on an input side and the second IDT electrode 51 on the output side in an example. The trapping energy mode portion 2 is formed in a manner that a planar shape seen from, for example, an upper side is a quadrangle and one side thereof is, for example, about several hundred μm in length. The trapping energy mode portion 2 is disposed in a manner that, for example, two sides of the quadrangle that face to each other are parallel to a traveling direction of the SAW, (in other words, the SAW is input perpendicularly to the remaining two sides of the quadrangle).

Figure 3:
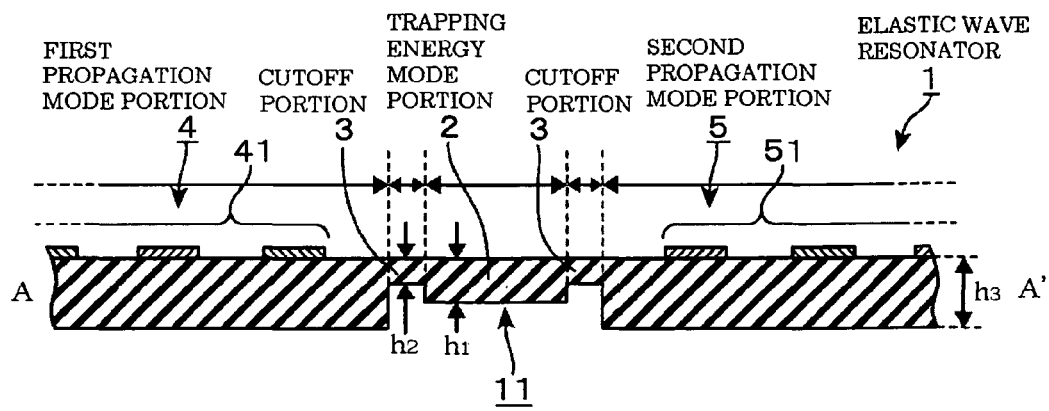
FIG. 3 is a vertical sectional side view of the elastic wave resonator.

The trapping energy mode portion 2 according to this example, as illustrated in FIG. 1 and FIG. 3, is provided in a recessed portion 11 formed at the center portion on a surface (that is called a rear surface) opposite to a side of the front surface of the piezoelectric body 10 where the already-described IDT electrodes 41, 51 are formed, and is formed to project in a terrace shape (mesa shape) from a bottom surface of the recessed portion 11. A rectangular parallelepiped portion ranging from an upper surface of the region projecting in a terrace shape to the front surface of the piezoelectric body 10 corresponds to the trapping energy mode portion 2.

The cutoff portion 3 is one region in the piezoelectric body 10, which is formed to surround the above-described trapping energy mode portion 2, and forms the recessed portion 11 integrally with the trapping energy mode portion 2. The cutoff portion 3 corresponds to an angular ring-shaped portion ranging from the bottom surface of the recessed portion 11 formed one step lower than the trapping energy mode portion 2 to the front surface of the piezoelectric body 10.

Since the trapping energy mode portion 2 and the cutoff portion 3 are provided at substantially the center position of the piezoelectric body 10 as illustrated in FIG. 1, in this example, when seen from the trapping energy mode portion 2 and the cutoff portion 3, a region on an upstream side in the propagation direction of the SAW corresponds to a first propagation mode portion 4, and similarly a region on a downstream side thereof corresponds to a second propagation mode portion 5.

Here, as explained in DESCRIPTION OF THE RELATED ART, a conventional trapping energy type resonator achieves trapping energy in regions having electrodes provided thereon by using a mass loading effect of the electrodes. In contrast, in the trapping energy mode portion 2 and the cutoff portion 3 according to this embodiment, the respective regions are formed in a manner that the thickness "$h_1$" of the trapping energy mode portion 2 is thicker than a thickness "$h_2$" of the cutoff portion 3 as illustrated in FIG. 3, for example, and thereby the elastic wave resonator 1 has a significant characteristic with regard to a point on which trapping energy in the trapping energy mode portion 2 is achieved by making a resonant frequency of thickness vibration in the trapping energy mode portion 2 lower than a cutoff frequency in the cutoff portion 3.

Figure 4:
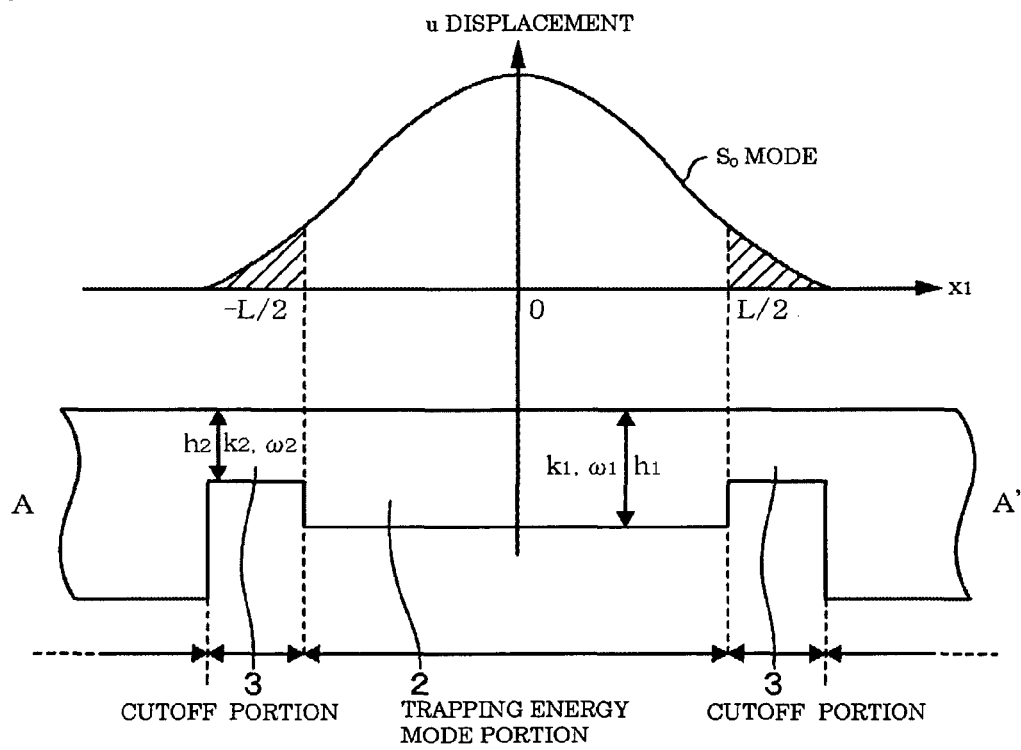
FIG. 4 is a schematic view illustrating excitation intensity of an elastic wave in a trapping energy mode in the elastic wave resonator.

Sizes of the trapping energy mode portion 2 and the cutoff portion 3 are illustrated in an exaggerated manner in each of the drawings such as FIG. 1 and FIG. 4, in order to make a state where the trapping energy mode portion 2 projects in a terrace shape from the bottom surface of the recessed portion 11 understandable, but the elastic wave resonator 1 whose resonant frequency is, for example, approximately 100 MHz is constituted as an extremely small-sized device such that the thicknesses "$h_1$", "$h_2$" of the regions of the trapping energy mode portion 2 and the cutoff portion 3 in the piezoelectric body 10 are about ten-odd μm, and further a difference between the thicknesses of the trapping energy mode portion 2 and the cutoff portion 3, namely a height of the portion projecting in a terrace shape is, for example, about ten-odd nm. Further, at a resonant frequency that is a higher frequency such as a gigahertz, the thicknesses "$h_1$", "$h_2$" of the trapping energy mode portion 2 and the cutoff portion 3 and the height of the terrace are further reduced.

There will be explained one example of a designing method to determine the sizes of the trapping energy mode portion 2 and the cutoff portion 3. When standing waves of a thickness vibration wave whose wavelength is n/2 (n is an integer) are generated in the trapping energy mode portion 2 and the cutoff portion 3 having the thicknesses "$h_1$", "$h_2$" respectively as illustrated in FIG. 4, it is possible to express a relationship between a cutoff angular frequency "$\omega_1$" in the trapping energy mode portion 2 and the thickness "$h_1$" by the following expression (1), and to express a relationship between an angular frequency "$\omega$" of the standing wave to be formed in the trapping energy mode portion 2 and a wave number thereof by the following expression (2).

[Numerical Expression 1]

$$\omega_1 = \frac{n\pi v_p}{h_1} \quad (1)$$

$v_p$ is a velocity of a plane wave propagating in a thickness direction.

[Numerical Expression 2]

$$k_1 = \frac{1}{\beta v_p}\sqrt{\omega^2 - \omega_1^2} \quad (2)$$

β is a constant determined by a piezoelectric material or a propagation mode.

Further, it is possible to express a relationship between a cutoff angular frequency "$\omega_2$" in the cutoff portion 3 and the thickness "$h_2$" by the following expression (3), and to express a relationship between an angular frequency "$\omega$" of the standing wave to be formed in the cutoff portion 3 and a wave number thereof by the following expression (4).

[Numerical Expression 3]

$$\omega_2 = \frac{n\pi v_p}{h_2} \quad (3)$$

[Numerical Expression 4]

$$k_2 = \frac{-j}{\beta v_p}\sqrt{\omega_2^2 - \omega^2} \quad (4)$$

j is an imaginary number.

At this time, as schematically illustrated in FIG. 4, when a thickness vibration wave in an $S_0$ mode (a symmetric mode) being the trapping energy mode is excited in the trapping energy mode portion 2, a resonant angular frequency $\omega_R$ thereof falls within a range of $\omega_1 < \omega_R < \omega_2$. At this time, when an approximate expression to express displacement u of the thickness vibration wave each excited in the trapping energy mode portion 2 and the cutoff portion 3 is made and a condition that the displacement and an inclination of the displacement in an $x_1$ direction are continuous in boundaries between the trapping energy mode portion 2 and the cutoff portion 3 is satisfied, as for wave numbers $k_1$, $k_2$ to be specified in the above-described expressions (2), (4), a relationship of the following expression (5) is established.

[Numerical Expression 5]

$$k_1 \tan\frac{k_1}{L} = jk_2 \quad (5)$$

L is the length of the trapping energy mode portion 2 in the longitudinal direction (A-A' direction).

As described above, in the expressions (1) to (4), the angular frequency "ω" of the standing wave satisfying a condition of the expression (5) corresponds to the resonant angular frequency "$\omega_R$".

A piezoelectric material to constitute the piezoelectric body 10 is selected according to the relationships explained above, and the resonant angular frequency "$\omega_R$" of the elastic wave resonator 1 is set to thereby obtain the thickness "$h_1$" and the length "L" of the trapping energy mode portion 2 and the thickness "$h_2$" of the cutoff portion 3 that enable the above resonant angular frequency to be obtained, by, for example, trial and error, by the expressions (1) to (5), and thereby the sizes of the trapping energy mode portion 2 and the cutoff portion 3 can be determined. Note that in the above-described designing method, one example of a way to obtain the sizes of the trapping energy mode portion 2 and the cutoff portion 3 is schematically described, and the elastic wave resonator 1 according to this embodiment is not limited to the trapping energy mode portion 2 and the cutoff portion 3 designed by the above designing method. It is a matter of course that by using, for example, a simulator or the like, a condition capable of obtaining resonance in the trapping energy mode at the designed resonant angular frequency "$\omega_R$" is searched, and thereby the sizes of the trapping energy mode portion 2 and the cutoff portion 3 may be determined. Further, if a structure simulator capable of calculating a frequency characteristic in an arbitrary shape such as a finite element method is used at this time, it is possible to design the trapping energy mode portion 2 and the cutoff portion 3 simply.

Figure 5:
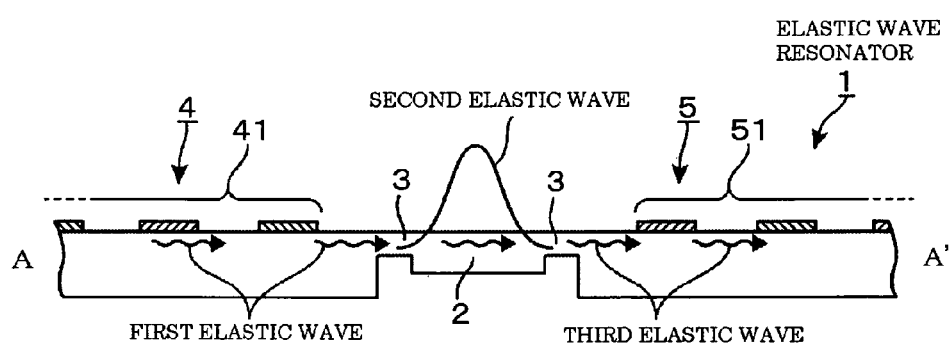
FIG. 5 is a schematic view illustrating how a surface acoustic wave propagates in the elastic wave resonator and the elastic wave in the trapping energy mode is excited.

The operation of the elastic wave resonator 1 provided with the constitution explained above is explained. When an electrical signal is input to the first IDT electrode 41 on the input side at present, the electrical signal is electro-mechanically converted in the IDT electrode 41, and a SAW is excited and propagates in the vicinity of the front surface of the piezoelectric body 10 in the elastic wave waveguide of the first propagation mode portion 4 as illustrated in FIG. 5. The SAW being an elastic wave in a propagation mode, which is excited in the first IDT electrode 41 and propagates through the elastic wave waveguide, is called a first elastic wave, and the first elastic wave later reaches the region where the recessed portion 11 is formed on the rear surface side.

As is the recessed portion 11 in the elastic wave resonator 1 according to this embodiment, in the region where, for example, side peripheral walls of the recessed portion 11 are formed substantially vertically and a shape of the piezoelectric body 10 changes discontinuously, most of the SAW propagated through the elastic wave waveguide is reflected in the above discontinuous region. However, the SAW is an elastic wave propagating while focusing energy in the vicinity of the front surface of the piezoelectric body 10, and thus there is sometimes a case that part of the SAW, without being reflected in the discontinuous region, further propagates through the flat region on the front surface side of the piezoelectric body 10 and then is able to reach the region where the recessed portion 11 is formed on the rear surface side.

The SAW that reaches the recessed portion 11 passes through the cutoff portion 3 to reach the trapping energy mode portion 2. At this time, when a frequency component capable of exciting an elastic wave in an trapping energy mode in the trapping energy mode portion 2 is included in the SAW being the first elastic wave that reaches the trapping energy mode portion 2, part of the first elastic wave is mode-converted to an elastic wave in a trapping energy mode (that will be called a second elastic wave, hereinafter) in the trapping energy mode portion 2 and resonance illustrated schematically in FIG. 4 and FIG. 5 is generated.

With respect to the second elastic wave excited in the trapping energy mode portion 2, the cutoff portion 3 formed in the periphery of the trapping energy mode portion 2 has a cutoff frequency being a frequency higher than that of the second elastic wave, so that energy that the second elastic wave has is brought into a state where it is trapped in the trapping energy mode portion 2. However, the vibration energy of the second elastic wave is not brought into an off state of its on/off in the cutoff portion 3 in a rectangular function manner, but it is attenuated exponentially as illustrated in FIG. 4, FIG. 5.

Therefore, the vibration energy of the part of the second elastic wave leaks into an outside region through the cutoff portion 3 and is converted to a new elastic wave in a propagation mode. Then, the above new elastic wave converted to a propagation mode (for example, the SAW), (which is called a third elastic wave), propagates through the elastic wave waveguide on a side of the second propagation mode portion 5 to reach the second IDT electrode 51 on the output side. As a result, in the second IDT electrode 51, an electrical signal is taken out by mechano-electrical conversion.

Figure 6:
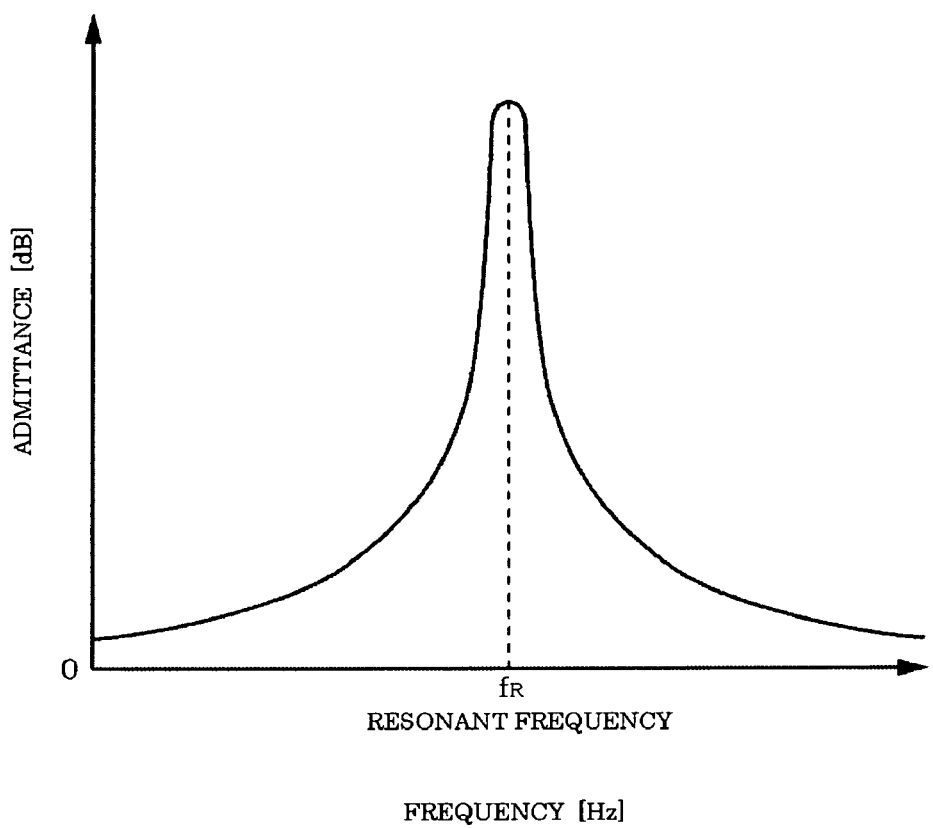
FIG. 6 is a view of a frequency characteristic illustrated by the elastic wave resonator.

By the resonance of the second elastic wave to be excited in the trapping energy mode portion 2, the elastic wave resonator 1 according to this embodiment exhibits a frequency characteristic in which an admittance is made maximum at a resonant frequency "$f_R$" as illustrated in FIG. 6, and can perform frequency control and frequency selection by using the above frequency characteristic.

Next, there will be explained one example of a method of manufacturing the elastic wave resonator 1 according to this embodiment with reference to FIG. 7(a) to FIG. 7(f). First, a resist 60 is coated on a surface to be the rear surface of the piezoelectric body 10 (FIG. 7(a)), and the resist 60 is patterned according to the planar shape of the recessed portion 11 (FIG. 7(b)). Then, the piezoelectric body 10, by using anisotropic etching such as dry etching, for example, is shaved to, for example, the position of the height corresponding to an upper surface of the trapping energy mode portion 2 to form the recessed portion 11 (FIG. 7(c)).

Figure 7:
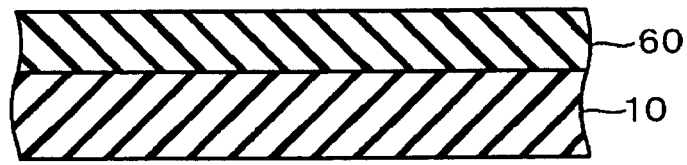
FIG. 7(*a*) to FIG. 7(*f*) are explanatory views illustrating processes of manufacturing the elastic wave resonator.
Figure 7:
Figure 7:
Figure 7:
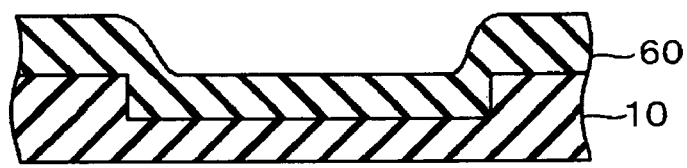
Figure 7:
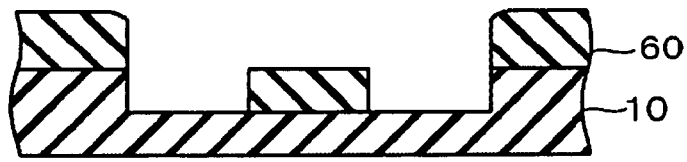
Figure 7:
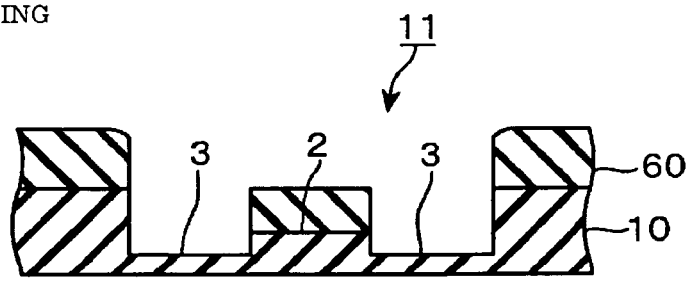

Next, the resist 60 is coated on the surface of the piezoelectric body 10, where the recessed portion 11 is formed (FIG. 7(d)), and the peripheral region of the trapping energy mode portion 2 to project in a terrace shape is patterned in an angular ring shape to expose a region where the cutoff portion 3 is formed (FIG. 7(e)). Then, the exposed region is again shaved by dry etching or the like, to form the trapping energy mode portion 2 and the cutoff portion 3 (FIG. 7(f)). Next, on the front surface side of the piezoelectric body 10 where the recessed portion 11 is not formed, the first and second IDT electrodes 41, 51 are patterned by using, for example, photolithography, and the elastic wave resonator 1 provided with the already described constitution is obtained.

The elastic wave resonator 1 according to this embodiment has the following effect. The SAW being the first elastic wave in the propagation mode is propagated through the elastic wave waveguide, and the second elastic wave in the trapping energy mode is excited by a specific frequency component included in the first elastic wave in the trapping energy mode portion 2 provided in the elastic wave waveguide and whose periphery is surrounded by the cutoff portion 3, and thereby a resonance response can be obtained without providing an electrode on the trapping energy mode portion 2. Therefore, a change in a frequency characteristic due to a mass change in an electrode does not occur in the trapping energy mode portion 2, so that an elastic wave device in which further miniaturization thereof is easy to be performed and a frequency fluctuation due to aging hardly occurs can be obtained.

Here, in the elastic wave resonator 1, the IDT electrode 41 is provided on the input side of a frequency signal and the IDT electrode 51 is provided on the output side of a frequency signal respectively. However, even when these IDT electrodes 41, 51 oxidize or corrode to cause a change in their masses, the first elastic wave (SAW in this example) to be excited in the piezoelectric body 10 is little affected by the change. Then, the trapping energy mode portion 2 and the cutoff portion 3 where resonance occurs are provided completely independently of the IDT electrodes 41, 51 and are not affected by the change in their masses, so that a resonant frequency does not change with time and a stable frequency characteristic is exhibited.

Here, as the operation of the above-described elastic wave resonator 1 has been explained by using FIG. 5, as for the SAW being the first elastic wave that reaches the region where the recessed portion 11 is formed on the rear surface side, part of the SAW is converted to the second elastic wave in the trapping energy mode in the trapping energy mode portion 2, but as for the SAW that is not converted to the second elastic wave, part of the SAW further passes through the region where the recessed portion 11 is formed, and propagates through the second propagation mode portion 5 to reach the second IDT electrode 51. If the SAW being the first elastic wave passes through the elastic wave waveguide as it is to be taken out as an electrical signal in the second IDT electrode 51 in this manner, there is sometimes a case that the first elastic wave becomes an unnecessary signal, namely noise in detecting the third elastic wave leaked from the trapping energy mode portion 2.

Figure 8:
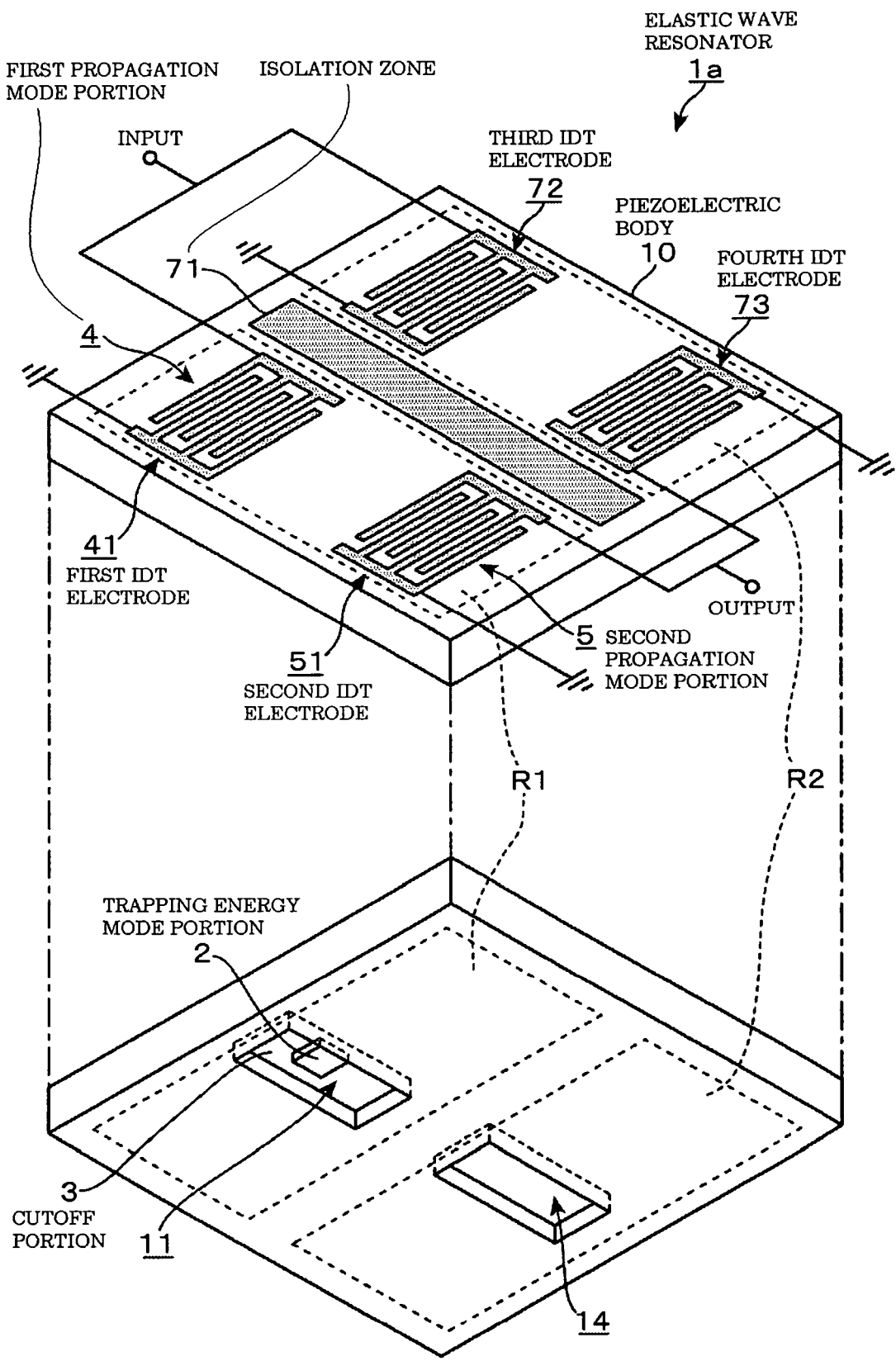
FIG. 8 is a perspective view illustrating an exterior constitution of a differential type elastic wave resonator.

Thus, in order to suppress an influence of noise of the first elastic wave passing through the recessed portion 11, an elastic wave resonator 1*a* illustrated in FIG. 8 is structured in a manner that an elastic wave waveguide for reference is provided adjacently to an elastic wave waveguide provided with a trapping energy mode portion 2, and by differentiating both the elastic wave waveguides, the noise is cancelled.

As for the elastic wave resonator 1*a* illustrated in FIG. 8, in a region R1 illustrated on a near side of an isolation zone 71 made of, for example, a metal film or the like, the elastic wave waveguide provided with first and second IDT electrodes 41, 51, and the trapping energy mode portion 2 and a cutoff portion 3 that are provided between the first IDT electrode 41 and the second IDT electrode 51 is formed similarly to the already described elastic wave resonator 1 illustrated in FIG. 1 to FIG. 4. On the other hand, in a region R2 on a far side across the isolation zone 71, the elastic wave waveguide for reference for reducing an influence of the above-described noise is formed.

The elastic wave waveguide for reference formed in the region R2 is provided with a third IDT electrode 72 and a fourth IDT electrode 73 that are constituted substantially similarly to, for example, the first and second IDT electrodes 41, 51, at both ends of the elastic wave waveguide for reference, and the third and fourth IDT electrodes 72, 73 are disposed in a manner that, for example, an interval between the third IDT electrode 72 and the fourth IDT electrode 73 is made the same as that between the first IDT electrode 41 and the second IDT electrode 51 on a region R1 side. Further, on a rear surface side of the elastic wave waveguide for reference, a second recessed portion 14 is provided, and the second recessed portion 14, similarly to a recessed portion 11 (that is called a first recessed portion 11 in an example (the elastic wave resonator 1*a*) for distinction) on the region R1 side, is disposed at a substantially center position of the third IDT electrode 72 and the fourth IDT electrode 73. Further, a shape (planar shape or depth) of the second recessed portion 14 is also constituted substantially similarly to that of the first recessed portion 11 on the region R1 side, but a point on which a trapping energy mode portion 2 is not provided in the second recessed portion 14 differs.

Thus, when the first and third IDT electrodes 41, 72 are connected to a common input terminal and a frequency signal is input in the respective regions R1, R2, for example, SAWs having substantially the same phases and amplitudes are excited in and propagate through the respective elastic wave waveguides because these IDT electrodes 41, 72 are constituted substantially similarly to each other and further are provided on a common piezoelectric body 10.

The SAW propagating through the elastic wave waveguide in the region R1 exhibits a behavior similar to that of the elastic wave resonator 1 described already, but on the other hand, the SAW propagating through the elastic wave waveguide in the region R2, when reaching the second recessed portion 14, exhibits a behavior similar to that in which the SAW propagating through the elastic wave waveguide in the region R1 is reflected in the first recessed portion 11 and reaches the fourth IDT electrode 73 without being affected by resonance in a trapping energy mode portion 2 because only the second recessed portion 14 is disposed and a trapping energy mode portion 2 is not provided in the elastic wave waveguide in the region R2. Then, in this example, the third IDT electrode 72 and the fourth IDT electrode 73 are disposed in a manner that the interval between the third IDT electrode 72 and the fourth IDT electrode 73 agrees with the interval between the first IDT electrode 41 and the second IDT electrode 51 on the region R1 side, but a bus bar to be grounded in the fourth IDT electrode 73 is set opposite that on a side of the second IDT electrode 51, and thereby an electrical signal made after the SAW is converted in the fourth IDT electrode 73 has an opposite phase to an electrical signal made after on the region R1 side, the SAW passes through the trapping energy mode portion 2 and the cut off portion 3 to be converted in the second IDT electrode 51.

Thus, by the sum of the electrical signal taken out of the second IDT electrode 51 on the region R1 side and the electrical signal in opposite phase to the above electrical signal on the region R1 side taken out of the fourth IDT electrode 73 on a region R2 side for reference, namely by differentiating both the elastic wave waveguides, it is possible to cancel the noise based on the first elastic wave reaching the second IDT electrode 51 on the region R1 side. At this time, the isolation zone 71 serves to prevent the respective elastic waves of the two elastic wave waveguides from being coupled.

Here, the interval between the IDT electrodes 72 and 73, an interval between electrode fingers, a connection method of an input terminal and an output terminal, and the like on a side of the elastic wave waveguide for reference are not limited to those in the above-described example, as long as an example has a constitution capable of canceling the noise by differentiating the two elastic wave waveguides, the example can be modified appropriately. Further, a constitution that the second recessed portion 14 described already is not provided on the rear surface side of the elastic wave waveguide for reference may also be applied.

Figure 9:
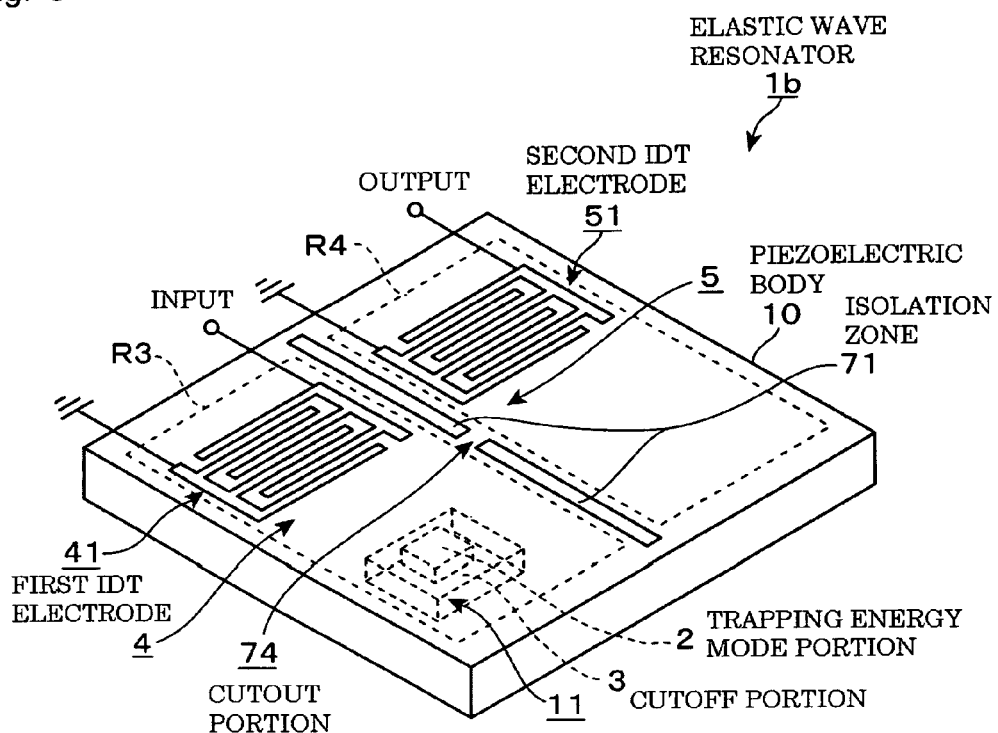
FIG. 9 is a perspective view illustrating an exterior constitution of an elastic wave resonator taking out a third elastic wave independently.

Next, an elastic wave resonator 1*b* illustrated in FIG. 9 will be explained. The point on which the elastic wave resonator 1*b* illustrated in FIG. 9 is structured in a manner that independently of a first elastic wave to be excited in a first IDT electrode 41, an elastic wave in a propagation mode reflected in a cutoff portion 3 is taken out as a third elastic wave is different from the elastic wave resonator 1 illustrated in FIG. 1, in which the elastic wave in the propagation mode leaked from the trapping energy mode portion 2 is set as the third elastic wave. The elastic wave resonator 1*b* is constituted in a manner that the first IDT electrode 41 to excite the first elastic wave and a second IDT electrode 51 to take an electrical signal out of the third elastic wave are disposed to be, for example, parallel to each other and an isolation zone 71 made of, for example, a metal film is disposed between the IDT electrode 41 and the IDT electrode 51.

Then, in a region on a near side from the isolation zone 71 (region R3 (first elastic wave waveguide)), where the first IDT electrode 41 on an excitation side is provided, on a rear surface side of a piezoelectric body 10 in the front of a propagation direction of a SAW (the first elastic wave) from the first IDT electrode 41, a recessed portion 11 provided with a trapping energy mode portion 2 and the cutoff portion 3 is disposed, and the region having the first IDT electrode 41 provided thereon and a region between the first IDT electrode 41 and the cutoff portion 3 are set as a first propagation mode portion 4 through which the first elastic wave propagates.

The already described isolation zone 71 is provided along the first propagation mode portion 4, and in the isolation zone 71, a cutout portion 74 is formed at a position between, for example, the first IDT electrode 41 and the cutoff portion 3. As a result, it makes it possible to propagate part of the SAW propagating through a side of the region R3 toward a side of a region R4 (second elastic wave waveguide) having the second IDT electrode 51 provided thereon through the cutout portion 74. In other words, the region R4 constituting the second elastic wave waveguide is disposed adjacently in a direction perpendicular to a traveling direction of the first elastic wave in the region R3 being the first elastic wave waveguide.

The operation of the elastic wave resonator 1b as constituted above will be explained with reference to FIG. 10. When an electrical signal is input, the SAW (first elastic wave) excited in the first IDT electrode 41 propagates through the first elastic wave waveguide (region R3) where the first propagation mode portion 4 is provided toward the recessed portion 11. Then, the SAW having a resonant frequency in the trapping energy mode portion 2 is mode-converted to a second elastic wave in a trapping energy mode to resonate in the trapping energy mode portion 2.

At this time, as for a reflected wave generated after the first elastic wave is reflected in the cutoff portion 3 and the trapping energy mode portion 2, a reflected amount thereof changes in accordance with a state of the resonance in the trapping energy mode portion 2, so that a frequency characteristic in which the resonance in the trapping energy mode portion 2 is affected can be obtained by receiving the above reflected wave in the second IDT electrode 51. The elastic wave resonator 1b according to an embodiment operates based on such a principle, and can be used for frequency control and frequency selection.

Returning to the explanation of the operation of the elastic wave resonator 1b, out of the first elastic wave, the elastic wave in the propagation mode (third elastic wave) reflected in the cutoff portion 3 spreads radially from the cutoff portion 3, but out of the above, most of the SAW propagating toward the region R4 (second elastic wave waveguide) where the second IDT electrode 51 is provided is reflected in the isolation zone 71. However, the cutout portion 74 is provided in the isolation zone 71 as described already, and thus part of the SAW that reaches the isolation zone 71 passes through the cutout portion 74 to enter the region R4.

The SAW (third elastic wave) that passes through the cutout portion 74 in this manner propagates in the region R4 through the cutout portion 74. When the SAW reaches the second IDT electrode 51, it can be taken out as an electrical signal independently of the first elastic wave.

Figure 10:
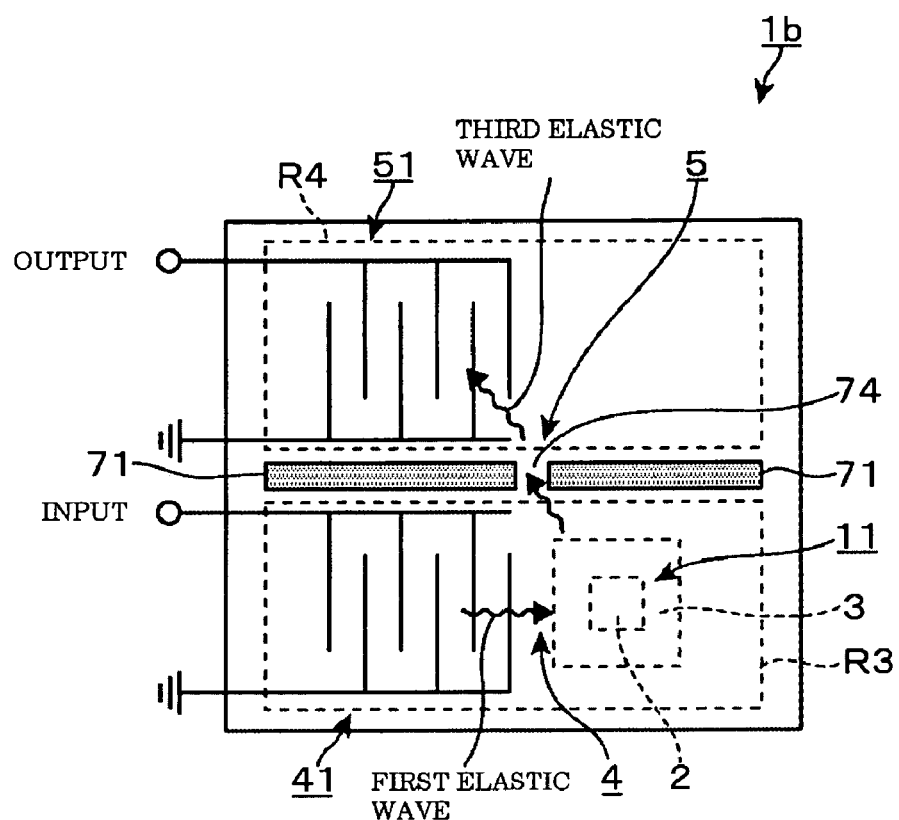
FIG. 10 is an operation view of the elastic wave resonator taking out the third elastic wave.

In the elastic wave resonator 1b according to FIG. 10, by using difference in the propagation directions of the first elastic wave and the third elastic wave in this manner, the third elastic wave is taken out independently.

Figure 11:
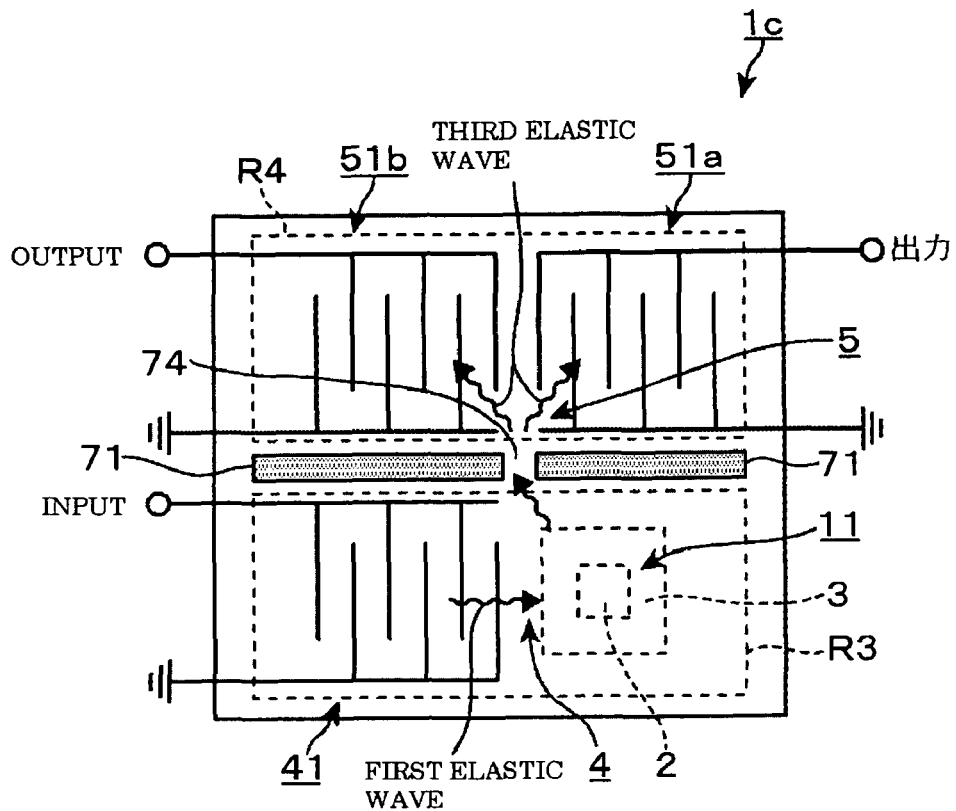
FIG. 11 is an explanatory view illustrating a modified example of the elastic wave resonator taking out the third elastic wave.

That is, in this example, a region ranging from a position of an outer end of the recessed portion 11 to a region where the second IDT electrode 51 is provided through the cutout portion 74 corresponds to a second propagation mode portion 5. Further, the second IDT electrode 51 is not limited to the case of being disposed on the left of the cutout portion 74 as illustrated in FIG. 10, and may also be disposed on the right. Further, as illustrated in FIG. 11, second IDT electrodes 51a, 51b are provided on both the right and left when seen from a cutout portion 74, and output may also be obtained from one side of either the second IDT electrode 51a or the second IDT electrode 51b.

Still another variation of each of the elastic wave resonators 1, 1a, and 1b described above will be explained, (which is illustrated as a variation of the elastic wave resonator 1 illustrated in FIG. 1 in the following example). The cross-sectional shape of the trapping energy mode portion 2, as illustrated in FIG. 3, FIG. 4, and so on, is not limited to the case when it is formed in a rectangular shape, and as illustrated in an elastic wave resonator 1d in FIG. 12, for example, a trapping energy mode portion 2 may also be formed in a plano-convex lens (plano-convex) shape. As illustrated in FIG. 4, the trapping energy mode being, for example, the $S_o$ mode exhibits a bell-shaped displacement distribution, and thus when the trapping energy mode portion 2 is formed in a shape corresponding to the above displacement distribution, the elastic wave in the trapping energy mode (second elastic wave) can be excited efficiently. In the above case, the plano-convex lens shape may be formed in a manner to form an image sensor of a CCD (Charged Coupled Device). Further, it is a matter of course that the trapping energy mode portion 2 is not limited to the plano-convex lens shape, and it may also be formed in a biconvex lens (biconvex) shape.

Figure 13:
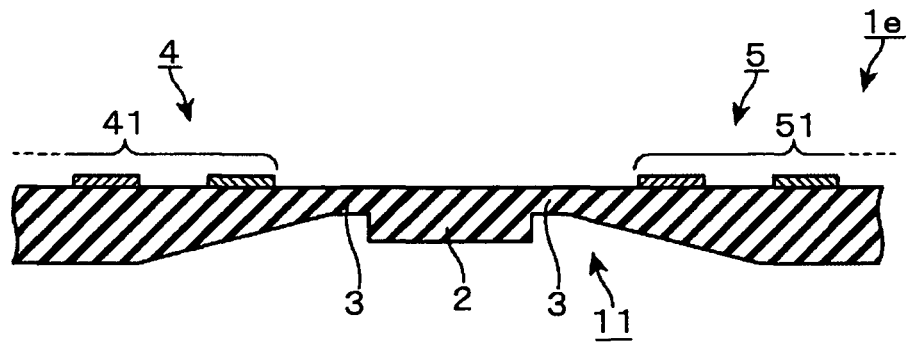
FIG. 13 is a vertical sectional side view of an elastic wave resonator having a trapping energy mode portion provided in a recessed portion provided with tapered surfaces.
Figure 14:
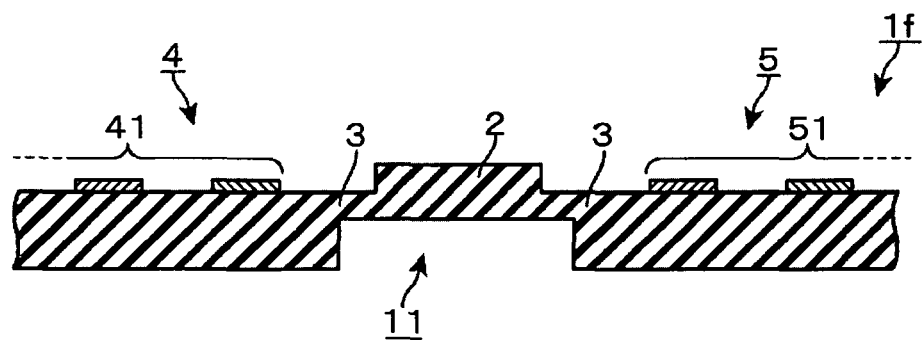
FIG. 14 is a vertical sectional side view of an elastic wave resonator having a trapping energy mode portion provided on a surface opposite to a recessed portion.
Figure 15:
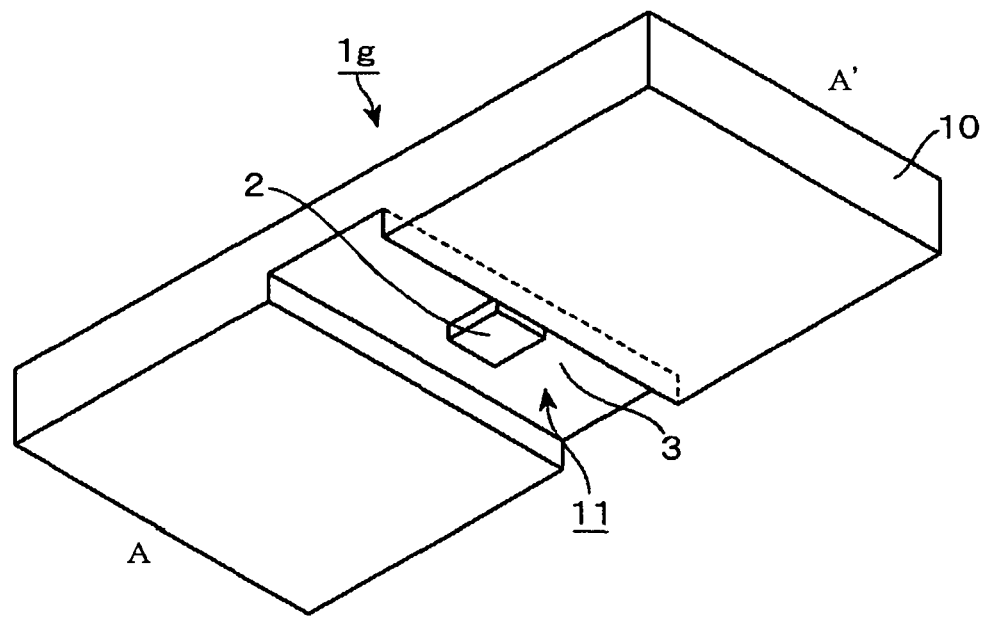
FIG. 15 is a perspective view illustrating another example of a recessed portion shape.

Further, a trapping energy mode portion 2, as illustrated in an elastic wave resonator 1e in FIG. 13, may also be formed in a recessed portion 11 provided with tapered surfaces formed by, for example, anisotropic etching or the like, or as illustrated in an elastic wave resonator 1f in FIG. 14, a trapping energy mode portion 2 may also project in a terrace shape on a front surface opposite to a recessed portion 11. Further, a recessed portion 11, as illustrated in an elastic wave resonator 1g in FIG. 15, may also be formed to cross an entire bottom surface side of a region having a trapping energy mode portion 2 and a cutoff portion 3 provided therein of a piezoelectric body 10.

Figure 16:
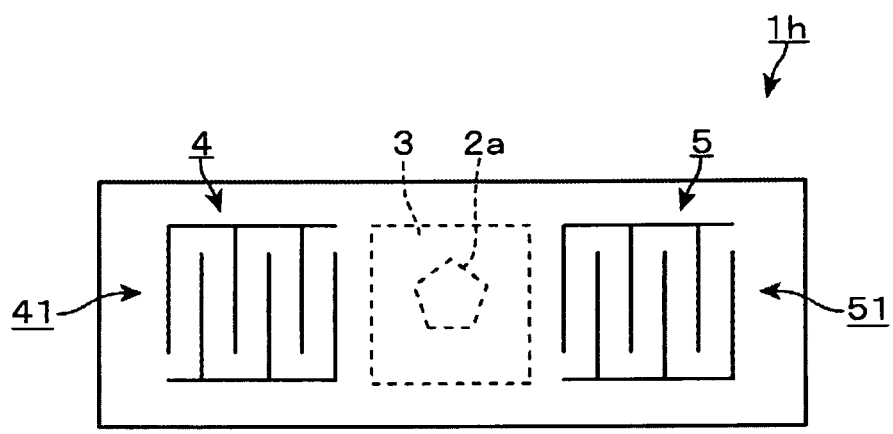
FIG. 16 is a plane view illustrating another example of a planar shape of the trapping energy mode portion.
Figure 17:
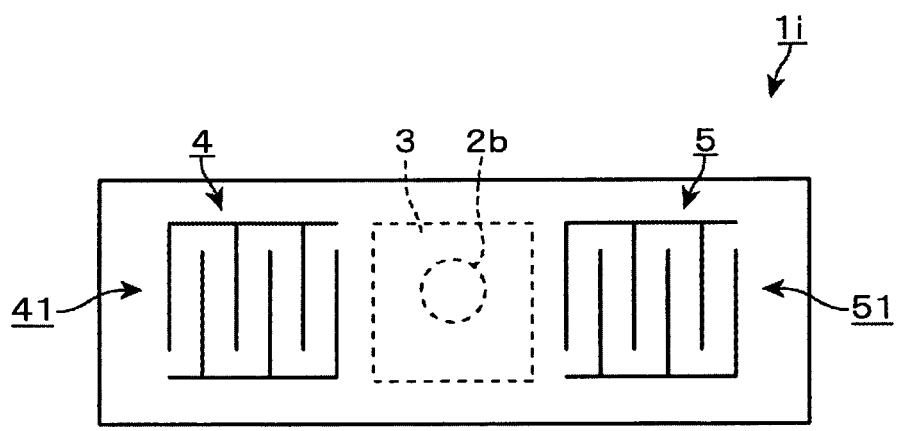
FIG. 17 is a plane view illustrating still another example of the planar shape.
Figure 18:
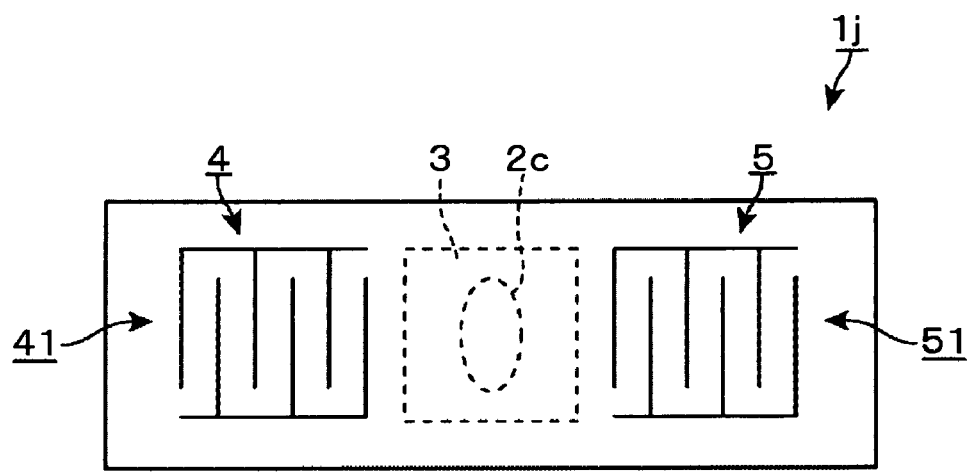
FIG. 18 is a plane view illustrating an example of the planar shape besides the above.

The planar shape of the trapping energy mode portion 2 is also not limited to the quadrangle such as a square or a rectangle, and as is an elastic wave resonator 1h in FIG. 16, it may also be a pentagon or a polygon with more than five sides, a circle (an elastic wave resonator 11 in FIG. 17), or an ellipse (an elastic wave resonator 1j in FIG. 18). In the case of the polygon, such as the previously described quadrangle, or a hexagon, if the trapping energy mode portion 2 is formed in a manner that respective sides of the planar shape come to the same dispositions in the case when the trapping energy mode portion 2 is rotated to 180° seen from the upper surface side as well, it is efficient to excite the elastic wave in the trapping energy mode. However, the above does not exclude the case when the planar shape of the trapping energy mode portion 2 is formed in a polygon having an odd number of sides such as a triangle.

Figure 19:
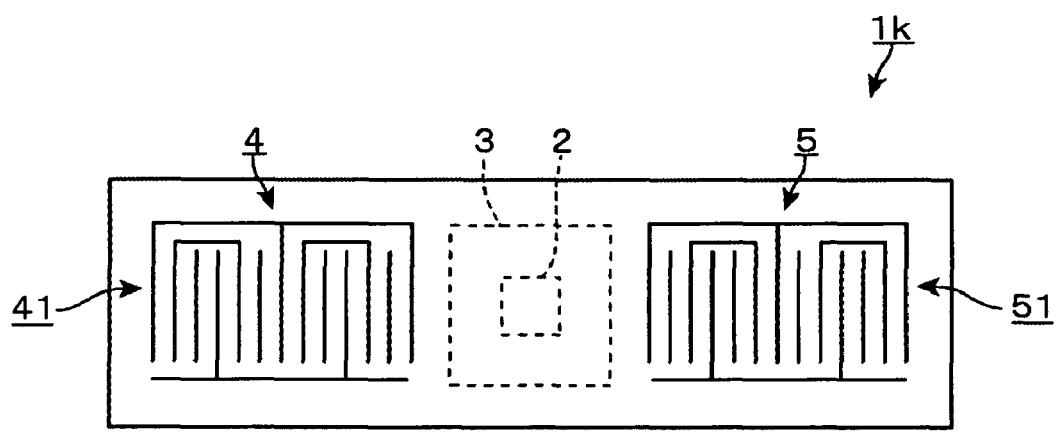
FIG. 19 is a plane view illustrating an elastic wave resonator provided with uni-directional transducer (UDT) electrodes.

Further, when the IDT electrodes to be provided on the first and second propagation mode portions 4, 5 are constituted as a uni-directional transducer electrode (UDT electrode), it is possible to propagate the SAW to the trapping energy mode portion 2 efficiently. In an elastic wave resonator 1k illustrated in FIG. 19, floating electrode type UDT electrodes are illustrated as the first and second IDT electrodes 41, 51, but the type of the UDT electrode is not limited to the above, and any type such as one provided with a distributed acoustic reflection transducer (DART) may also be applied. Further, if at least one of the first and second IDT electrodes 41, 51 is also set as the UDT electrode, the above effect can be obtained.

Figure 20:
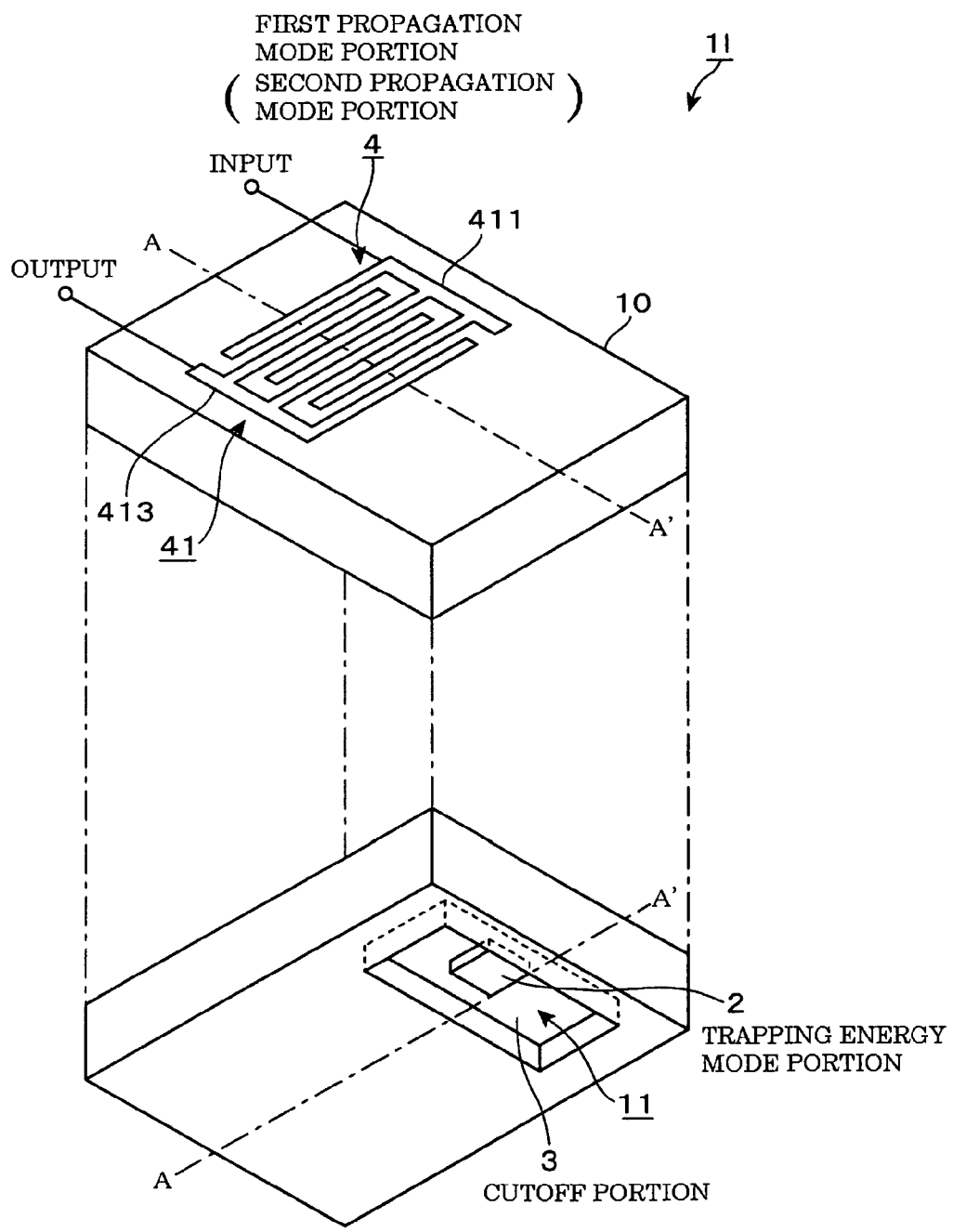
FIG. 20 is a perspective view illustrating an elastic wave resonator having an elastic wave waveguide provided only on one side of a trapping energy mode portion.

Further, in the embodiment illustrated in FIG. 1, and so on, there is described an example where the first propagation mode portion 4 and the second propagation mode portion 5 are formed to sandwich the trapping energy mode portion 2 and the cutoff portion 3 and the IDT electrode 41 for input is provided at the end of the first propagation mode portion 4 and the IDT electrode 51 for output is provided at the end of the second propagation mode portion 5 respectively, but the embodiment may also be constituted in a manner that the first propagation mode portion 4 is used as the second propagation mode portion. In the above case, such as an elastic wave resonator 11 illustrated in FIG. 20, it is only necessary that a bus bar 411 on one side of a first IDT electrode 41 provided on an upper surface on a first propagation mode portion 4 side is connected to an input terminal and a bas bar 413 on the other side is connected to an output terminal, resulting that the elastic wave resonator 11 can be further miniaturized.

Figure 21:
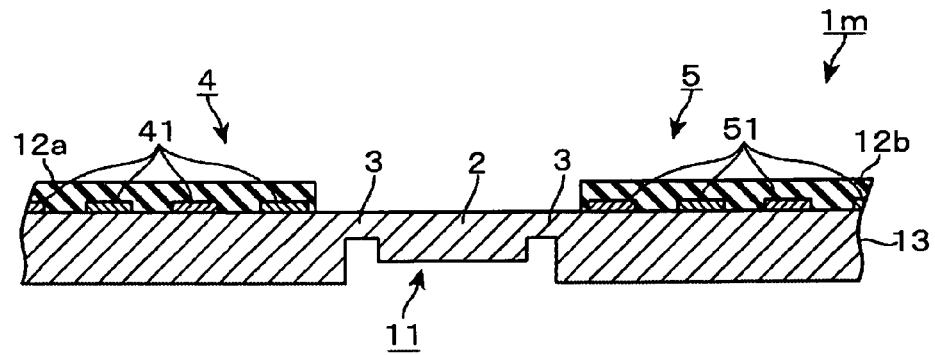
FIG. 21 is a vertical sectional side view of an elastic wave resonator having piezoelectric films provided on upper surfaces of IDT electrodes.
Figure 22:
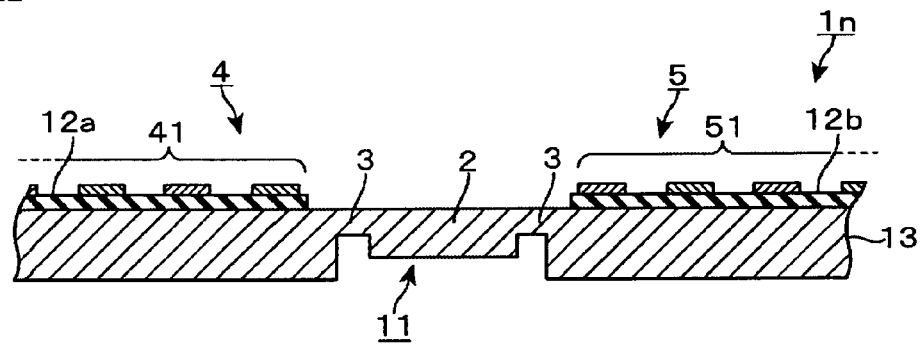
FIG. 22 is a vertical sectional side view of an elastic wave resonator having piezoelectric films provided on lower surfaces of IDT electrodes.

Further, the piezoelectric body is not limited to the case when it is formed on a side of lower surfaces of the IDT electrodes 41, 51. As is an elastic wave resonator 1m illustrated in FIG. 21, for example, it is also preferable that piezoelectric films 12a, 12b are stacked on a side of upper surfaces of IDT electrodes 41, 51 and an interconversion of a SAW and an electrical signal is performed. In the above case, each of a medium 13 provided on a side of lower surfaces of the IDT electrodes 41, 51 and propagating a SAW therethrough, a trapping energy mode portion 2, and a cutoff portion 3 is not necessary to be a piezoelectric body, but any one may also be applied if it is a material capable of propagating an elastic wave therethrough such as a non-piezoelectric material of, for example, silicon, diamond, sapphire, titanium or stainless steel being a metallic material with a corrosion resistance or the like. Besides the above, as is an elastic wave resonator 1n illustrated in FIG. 22, a constitution that piezoelectric films 12a, 12b are provided on an upper surface of a medium 13 propagating a SAW therethrough and IDT electrodes 41, 51 are formed on upper surfaces of these piezoelectric films 12a, 12b is also included in technical scope of the present invention.

Figure 23:
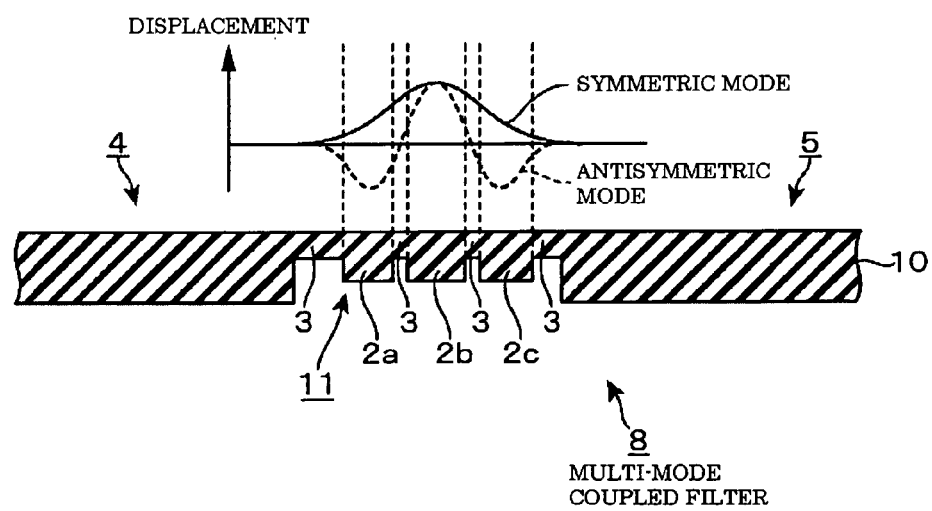
FIG. 23 is a vertical sectional side view illustrating a constitution example of a multi-mode coupled filter according to an embodiment.

Next, in FIG. 23, there is illustrated an example where a multi-mode coupled filter 8 is constituted by using the elastic wave in the trapping energy mode oscillated by the above-described principle. As for the trapping energy mode portion 2, a plurality of trapping energy mode portions whose peripheries are surrounded by a cutoff portion 3, which are, for example, three trapping energy mode portions 2a, 2b, and 2c, are provided in a propagation direction to be adjacent to one another, and intervals of these trapping energy mode portions 2a, 2b, and 2c are adjusted to a distance with such a degree that the trapping energy modes (second elastic waves) to be excited in the respective trapping energy mode portions 2a, 2b, and 2c generate mode coupling. As a result, it is possible to constitute a band filter by using difference in resonant frequencies of coupled modes (a symmetric mode and an antisymmetric mode, for example) to be excited in the trapping energy mode portions 2a, 2b, and 2c. The number of the trapping energy mode portions 2 to be provided in the multi-mode coupled filter 8 is not limited to the case of three, and it may also be, for example, two. Further, these trapping energy mode portions 2 may also be coupled in a direction perpendicular to a propagation direction of an elastic wave, (which is a lateral direction).

Further, the first propagation mode portion 4 and the second propagation mode portion 5 are not limited to the case when they are formed thicker than the cutoff portion 3. For example, a trapping energy mode portion 2 projecting in a terrace shape may also be provided in a piezoelectric body 10 formed to have the thickness "$h_2$" of the cutoff portion 3.

The elastic wave resonators 1, 1a to 1n and the multi-mode coupled filter 8 explained above are each used as an oscillator by being incorporated in, for example, a well-known Colpitts circuit, and further the multi-mode coupled filter 8 is used as an electronic component having a function of a band filter in itself.

Further, the piezoelectric material of the piezoelectric body 10 is not limited to the quartz-crystal, and it may also be, for example, lithium tantalate, lithium niobate, langasite, or the like. The elastic wave in the propagation mode to be used as the first and third elastic waves is also not limited to the SAW (surface acoustic wave), and a resonator of a type using, for example, an elastic boundary wave may also be applied.

Figure 24:
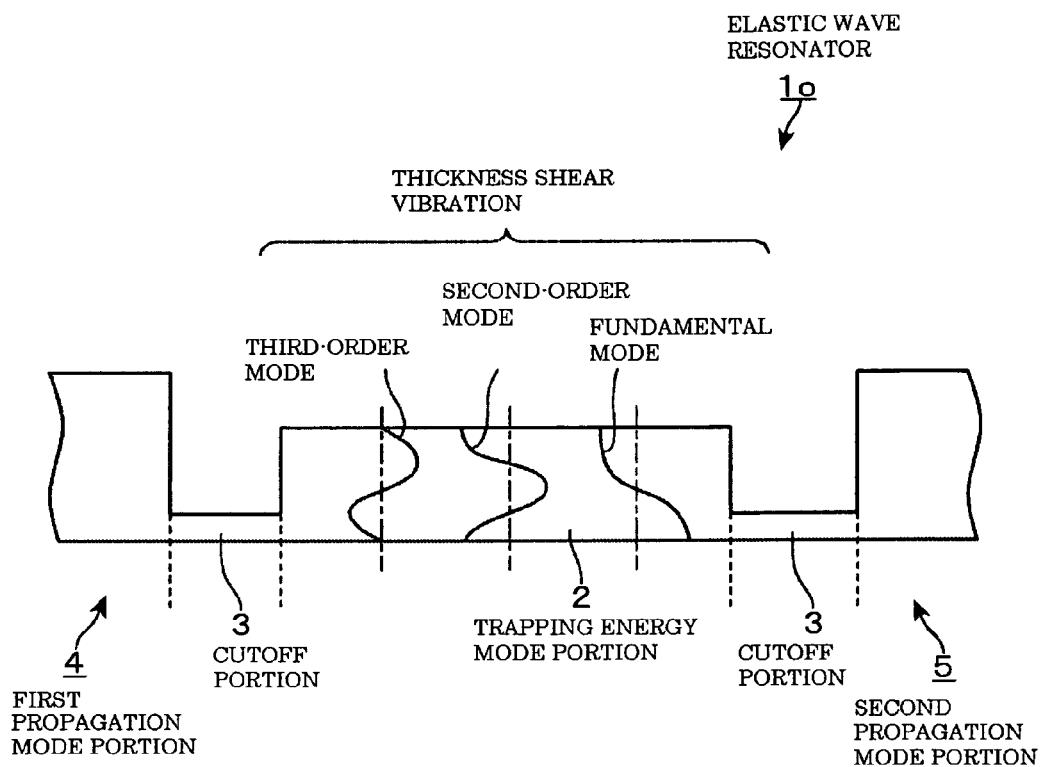
FIG. 24 is a side view of an elastic wave resonator using high-order thickness shear vibrations.

Furthermore, the trapping energy mode usable in the elastic wave resonator 1 of the present invention is not limited to the case when the trapping energy mode of thickness extensional vibration in which the displacement in the thickness direction of the elastic wave resonator 1 has a distribution in the longitudinal direction as illustrated in FIG. 4 is used. A trapping energy mode of, for example, thickness shear vibration with displacement in the longitudinal direction of the elastic wave resonator 1, or of thickness torsional vibration with displacement in the width direction of the elastic wave resonator 1, may also be used. For example, FIG. 24 is an example schematically illustrating an elastic wave resonator 1o using the trapping energy mode of the thickness shear vibration. As illustrated in the drawing, the order of the trapping energy mode is also not limited to the case when a minimum-order mode (a fundamental mode in the example of FIG. 24) is used, and a higher-order trapping energy mode may also be used. It is also possible to excite trapping energy modes of not only odd number-order modes (the fundamental mode, a third-order mode, . . . ) but also even number-order modes (a second-order mode, . . . ), and these even number-order modes are also included in the higher-order second elastic wave.

As for a method to design the trapping energy mode portion 2 capable of exciting the high-order trapping energy modes, the case in which a simulation is performed by appropriately changing the thicknesses "$h1$", "$h2$" of the trapping energy mode portion 2 and the cutoff portion 3, the length "L" of the trapping energy mode portion 2, selection of a material, a crystal direction of the material, and so on, to thereby search a condition that a trapping energy mode of a targeted order is excited, or the like can be considered.

Further, in the case when the thickness shear vibration is used, the thickness "$h1$" of the trapping energy mode portion 2 becomes thicker as the order of the trapping energy mode becomes higher, so that manufacturing and handling of the elastic wave resonator 1 become easy to be performed compared to the case when, for example, the minimum-order mode is used. Further, since it is possible to thicken the trapping energy mode portion 2 as described above, a ratio "V/S" of a volume V of the trapping energy mode portion 2 to a surface area S of both the upper and lower surfaces of the trapping energy mode portion 2 can be taken large. Even in the case when the elastic wave waveguide is constituted by, for example, a non-piezoelectric body material that is likely to deteriorate with time, or the like, it is possible to suppress a change in a resonant frequency of the trapping energy mode accompanied by a volume change due to deterioration with time, or the like when a value of "V/S" is increased. Further, the high-order trapping energy modes usable in the elastic wave resonator of the present invention are not limited to the example of the thickness shear vibration illustrated in FIG. 24, and it is a matter of course that high-order energy tapping modes of the thickness extensional vibration or the thickness torsional vibration may also be used.

Figure 25:
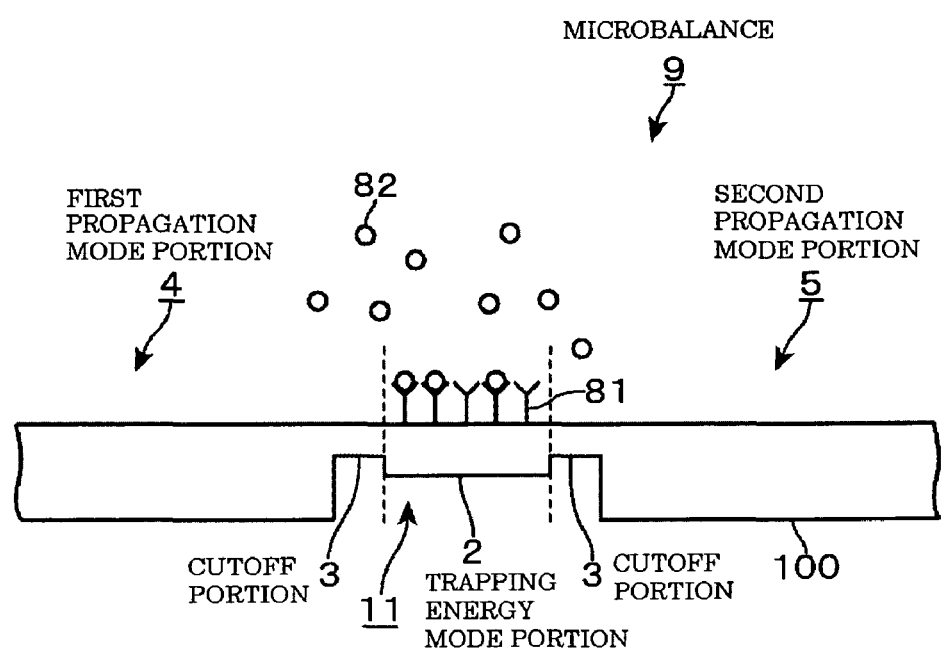
FIG. 25 is a side view illustrating a constitution example of a microbalance according to an embodiment.

Next, in FIG. 25, there will be illustrated an example where a microbalance 9 is constituted by using an elastic wave waveguide 100, (which may be a piezoelectric body or a non-piezoelectric body), in an embodiment. As for the microbalance, a QCM (Quartz Crystal Microbalance) in which a change in a natural frequency ascribable to adsorption of a substance to be sensed to a quartz-crystal vibrator is detected to specify an adsorption amount of the substance to be sensed, or the like has been known, but the microbalance 9 according to this example specifies an adsorption amount of a substance to be sensed by using a change in a resonant frequency of the trapping energy mode. The microbalance 9 illustrated in FIG. 25, similarly to the elastic wave resonator 1 illustrated in the drawings, for example, has a projecting portion in a terrace shape of a trapping energy mode portion 2 provided in a recessed portion 11. Accordingly, on a surface opposite the projecting portion, a flat surface without concavity and convexity is formed from a first propagation mode portion 4 to a second propagation mode portion 5.

Then, on a region corresponding to the trapping energy mode portion 2 of the above flat surface, an adsorption layer 81 to adsorb a substance to be sensed 82 is provided. When a specific antigen in blood or serum, or the like is sensed as the substance to be sensed 82, for example, an antibody selectively reacting with and binding to the substance to be sensed 82, or the like, is used for the adsorption layer 81. Then, when the substance to be sensed 82 is adsorbed to the above adsorption layer 81, by a mass loading effect, a thickness of the trapping energy mode portion 2 apparently increases in view of a high likelihood of vibration. As a result, a cutoff frequency of the trapping energy mode portion 2 is reduced. A resonant frequency of the trapping energy mode is also reduced in proportion to the above reduction in the cutoff frequency, so that it is possible to specify an amount of the substance to be sensed 82 adsorbed to the adsorption layer 81 based on a correspondence relation between a reduction amount of the resonant frequency and an adsorption amount of the substance to be sensed 82.

Figure 12:
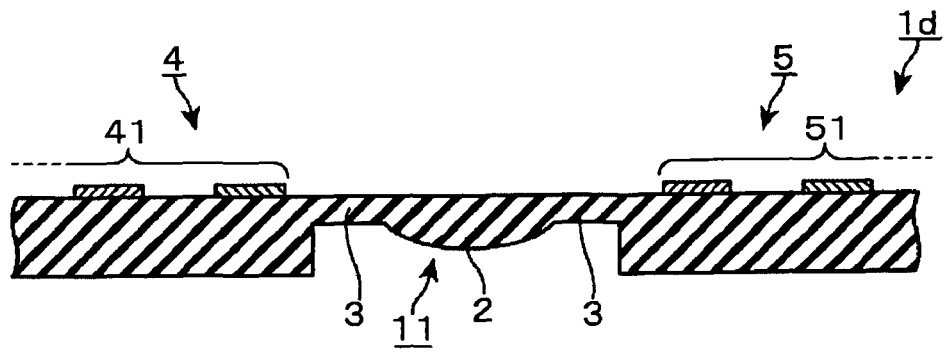
FIG. 12 is a vertical sectional side view of an elastic wave resonator in which a cross sectional shape of a trapping energy mode portion is formed in a plano-convex lens shape.

A constitution example of the microbalance 9 is explained by using FIG. 25 as above, but, for example, the adsorption layer 81 may be provided on a projecting portion side of the trapping energy mode portion 2, or a microbalance 9 constituted similarly to the elastic wave resonators 1*d* and 1*e* illustrated in FIG. 12, FIG. 13, and so on, may be used.

What is claimed is:

1. An elastic wave device comprising:
   a first propagation mode portion provided in an elastic wave waveguide and provided with a first IDT electrode for making a piezoelectric material excite a first elastic wave being an elastic wave in a propagation mode;
   a trapping energy mode portion provided in the elastic wave waveguide and in which a second elastic wave being an elastic wave in a trapping energy mode is excited by a specific frequency component included in the first elastic wave propagated from the first propagation mode portion;
   a cutoff portion provided in a peripheral region of the trapping energy mode portion and having a cutoff frequency being a frequency higher than that of the second elastic wave; and
   a second propagation mode portion provided at a position adjacent to the trapping energy mode portion across the cutoff portion along a direction in which the first elastic wave propagates, and mode-converting the second elastic wave leaked through the cutoff portion to a third elastic wave being the elastic wave in the propagation mode to propagate the third elastic wave, and provided with a second IDT electrode for taking the third elastic wave out of the piezoelectric material as an electrical signal.

2. The elastic wave device according to claim 1, wherein the first propagation mode portion is also used as the second propagation mode portion.

3. The elastic wave device according to claim 1, wherein an elastic wave waveguide for reference provided with a third IDT electrode for making the piezoelectric material excite an elastic wave for reference and a fourth IDT electrode provided in a propagation direction of the elastic wave for reference in order to take an electrical signal in opposite phase to an electrical signal taken out in the second IDT electrode after the first elastic wave passes through the first propagation mode portion and the second propagation mode portion out of the elastic wave for reference via the piezoelectric material, is provided parallel to the elastic wave waveguide via an isolation zone of an elastic wave, and a differential signal made after the electrical signal taken out of the second IDT electrode and the electrical signal taken out of the fourth IDT electrode are added is obtained.

4. An elastic wave device comprising:
   a first propagation mode portion provided in a first elastic wave waveguide and provided with a first IDT electrode for making a piezoelectric material excite a first elastic wave being an elastic wave in a propagation mode;
   a trapping energy mode portion provided in the first elastic wave waveguide and in which a second elastic wave being an elastic wave in a trapping energy mode is excited by a specific frequency component included in the first elastic wave propagated from the first propagation mode portion;
   a cutoff portion provided in a peripheral region of the trapping energy mode portion and having a cutoff frequency being a frequency higher than that of the second elastic wave;
   a second elastic wave waveguide adjacent to the first elastic wave waveguide in a direction perpendicular to a traveling direction of the first elastic wave;
   a second IDT electrode provided in the second elastic wave waveguide; and
   an isolation zone of an elastic wave provided between the first elastic wave waveguide and the second elastic wave waveguide and provided with a cutout portion having one portion thereof cut out, and wherein
   a third elastic wave being the elastic wave in the propagation mode obtained by reflecting the first elastic wave in the cutoff portion and the trapping energy mode portion is passed through the isolation zone via the cutout portion, and then the third elastic wave is received in the second IDT electrode to be taken out of the piezoelectric material as an electrical signal, and a region where the third elastic wave propagates is set as a second propagation mode portion.

5. The elastic wave device according to claim 1, wherein the first IDT electrode and the second IDT electrode are provided on a front surface of the piezoelectric material and the first elastic wave and the third elastic wave are surface acoustic waves.

6. The elastic wave device according to claim 1, wherein the cutoff portion is formed to have a cutoff frequency being a frequency higher than that of the second elastic wave because a thickness of the elastic wave waveguide constituting the cutoff portion is thinner than that of the elastic wave waveguide constituting the trapping energy mode portion.

7. The elastic wave device according to claim 1, wherein the elastic wave waveguide is formed in a manner that a thickness of an outer region of the cutoff portion is thicker than that of the cutoff portion.

8. The elastic wave device according to claim 1, wherein the elastic wave waveguide is made of a piezoelectric material.

9. The elastic wave device according to claim 1, wherein the piezoelectric material is a piezoelectric film provided on an upper surface side of an IDT electrode formed on an elastic wave waveguide made of a non-piezoelectric material, or is a piezoelectric film provided between an elastic wave waveguide made of a non-piezoelectric material and an IDT electrode.

10. The elastic wave device according to claim 1, wherein the trapping energy mode portion is formed in a flat plate shape.

11. The elastic wave device according to claim 1, wherein the trapping energy mode portion is formed in a plano-convex lens shape.

12. The elastic wave device according to claim 1, wherein the trapping energy mode portion is formed in a manner that a planar shape thereof is a polygon with four or more angles, or a circle, or an ellipse.

13. The elastic wave device according to claim 1, wherein at least one of the first IDT electrode and the second IDT electrode is made of a uni-directional transducer electrode.

14. The elastic wave device according to claim 1, further comprising:
two or more trapping energy mode portions whose peripheries are each surrounded by the cutoff portion, and wherein
the trapping energy mode portions are provided adjacently to each other or one another in the propagation direction of the elastic wave in the propagation mode or in a direction perpendicular to the propagation direction to enable second elastic waves to be excited in the respective trapping energy mode portions to be coupled to each other or one another, and thereby a multi-mode coupled filter is constituted.

15. An electronic component comprising:
the elastic wave device according to claims 1.

16. The elastic wave device according to claim 4, wherein the first IDT electrode and the second IDT electrode are provided on a front surface of the piezoelectric material and the first elastic wave and the third elastic wave are surface acoustic waves.

17. The elastic wave device according to claim 4, wherein the cutoff portion is formed to have a cutoff frequency being a frequency higher than that of the second elastic wave because a thickness of the elastic wave waveguide constituting the cutoff portion is thinner than that of the elastic wave waveguide constituting the trapping energy mode portion.

18. The elastic wave device according to claim 4, wherein the elastic wave waveguide is formed in a manner that a thickness of an outer region of the cutoff portion is thicker than that of the cutoff portion.

19. The elastic wave device according to claim 4, wherein the elastic wave waveguide is made of a piezoelectric material.

20. The elastic wave device according to claim 4, wherein the piezoelectric material is a piezoelectric film provided on an upper surface side of an IDT electrode formed on an elastic wave waveguide made of a non-piezoelectric material, or is a piezoelectric film provided between an elastic wave waveguide made of a non-piezoelectric material and an IDT electrode.

21. The elastic wave device according to claim 4, wherein the trapping energy mode portion is formed in a flat plate shape.

22. The elastic wave device according to claim 4, wherein the trapping energy mode portion is formed in a plano-convex lens shape.

23. The elastic wave device according to claim 4, wherein the trapping energy mode portion is formed in a manner that a planar shape thereof is a polygon with four or more angles, or a circle, or an ellipse.

24. The elastic wave device according to claim 4, wherein at least one of the first IDT electrode and the second IDT electrode is made of a uni-directional transducer electrode.

25. The elastic wave device according to claim 4, further comprising:
two or more trapping energy mode portions whose peripheries are each surrounded by the cutoff portion, and wherein
the trapping energy mode portions are provided adjacently to each other or one another in the propagation direction of the elastic wave in the propagation mode or in a direction perpendicular to the propagation direction to enable second elastic waves to be excited in the respective trapping energy mode portions to be coupled to each other or one another, and thereby a multi-mode coupled filter is constituted.

26. An electronic component comprising:
the elastic wave device according to claims 4.

27. The elastic wave device according to claim 1, wherein the second elastic wave is an elastic wave in a high-order trapping energy mode.

28. The elastic wave device according to claim 4, wherein the second elastic wave is an elastic wave in a high-order trapping energy mode.

29. The elastic wave device according to claim 1, wherein an adsorption layer to adsorb a substance to be sensed is formed on a front surface of the trapping energy mode portion.

30. The elastic wave device according to claim 4, wherein an adsorption layer to adsorb a substance to be sensed is formed on a front surface of the trapping energy mode portion.

* * * * *